(12) United States Patent
Kiyooka et al.

(10) Patent No.: US 11,909,415 B2
(45) Date of Patent: Feb. 20, 2024

(54) MEMORY SYSTEM

(71) Applicant: Kioxia Corporation, Tokyo (JP)

(72) Inventors: Masahiro Kiyooka, Yokohama Kanagawa (JP); Riki Suzuki, Yokohama Kanagawa (JP); Yoshihisa Kojima, Kawasaki Kanagawa (JP)

(73) Assignee: Kioxia Corporation, Tokyo (JP)

( * ) Notice: Subject to any disclaimer, the term of this patent is extended or adjusted under 35 U.S.C. 154(b) by 0 days.

(21) Appl. No.: 17/694,057

(22) Filed: Mar. 14, 2022

(65) Prior Publication Data
US 2023/0096401 A1 Mar. 30, 2023

(30) Foreign Application Priority Data

Sep. 22, 2021 (JP) ................................. 2021-154139

(51) Int. Cl.
| | | |
|---|---|---|
| H03M 13/11 | (2006.01) | |
| G11C 11/4074 | (2006.01) | |
| G11C 11/4096 | (2006.01) | |
| H03M 13/09 | (2006.01) | |

(52) U.S. Cl.
CPC ..... *H03M 13/1125* (2013.01); *G11C 11/4074* (2013.01); *G11C 11/4096* (2013.01); *H03M 13/098* (2013.01); *H03M 13/1108* (2013.01)

(58) Field of Classification Search
None
See application file for complete search history.

(56) References Cited

U.S. PATENT DOCUMENTS

| | | |
|---|---|---|
| 8,456,919 B1 | 6/2013 | Jeon et al. |
| 10,872,013 B2 | 12/2020 | Symons et al. |
| 10,963,338 B1* | 3/2021 | Steiner ............. G11C 29/50004 |
| 2013/0077400 A1* | 3/2013 | Sakurada ................ G11C 16/06 |
| | | 365/185.03 |
| 2014/0223263 A1 | 8/2014 | Sakurada et al. |
| 2016/0259683 A1* | 9/2016 | Sakurada ............. G11C 29/028 |
| 2017/0242748 A1* | 8/2017 | Lin ................... H03M 13/3707 |
| 2019/0220348 A1 | 7/2019 | Kokubun et al. |
| 2020/0065188 A1* | 2/2020 | Lee ........................ G11C 29/52 |
| 2020/0081770 A1 | 3/2020 | Kumano et al. |

FOREIGN PATENT DOCUMENTS

JP 2019-125910 A 7/2019

* cited by examiner

*Primary Examiner* — Guerrier Merant
(74) *Attorney, Agent, or Firm* — Foley & Lardner LLP

(57) ABSTRACT

A memory system according to an embodiment includes a nonvolatile memory and a memory controller. The nonvolatile memory includes a plurality of memory cells. The memory controller is configured to control the nonvolatile memory. In read operation for the memory cells, the memory controller is configured to: perform tracking including a plurality of reads in which a read voltage is shifted; determine a hard bit read voltage based on results of the tracking; calculate a soft bit read voltage based on the determined hard bit read voltage; perform soft bit read using the calculated soft bit read voltage; and perform a soft bit decoding process using a result of the soft bit read and a log-likelihood ratio table associated with the calculated soft bit read voltage.

18 Claims, 19 Drawing Sheets

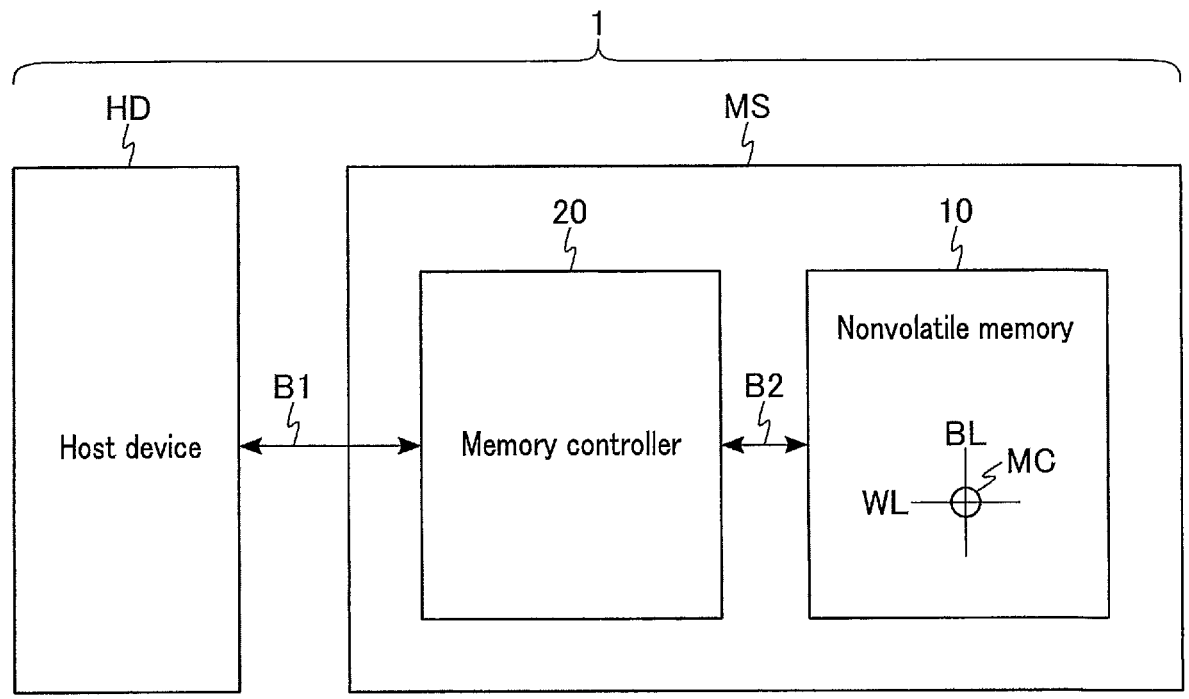
F I G. 1
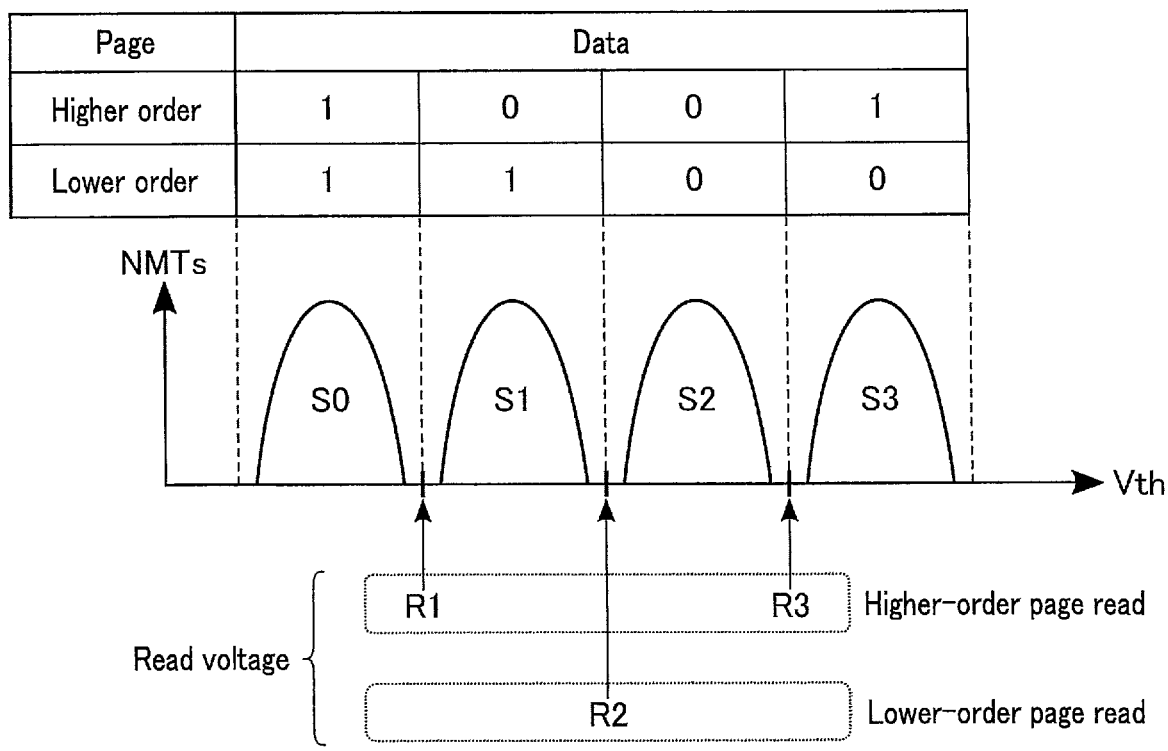
F I G. 2

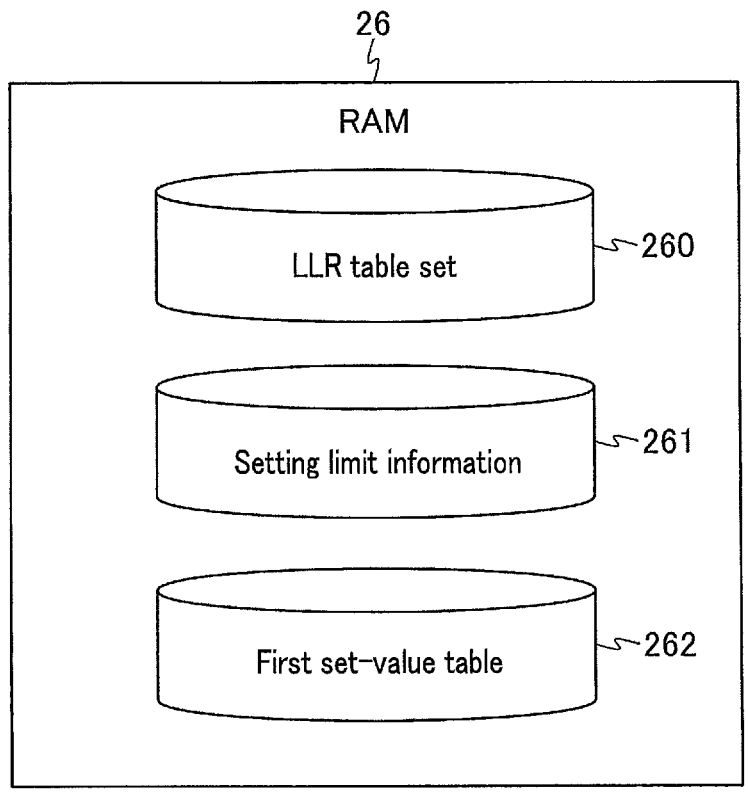
F I G. 5
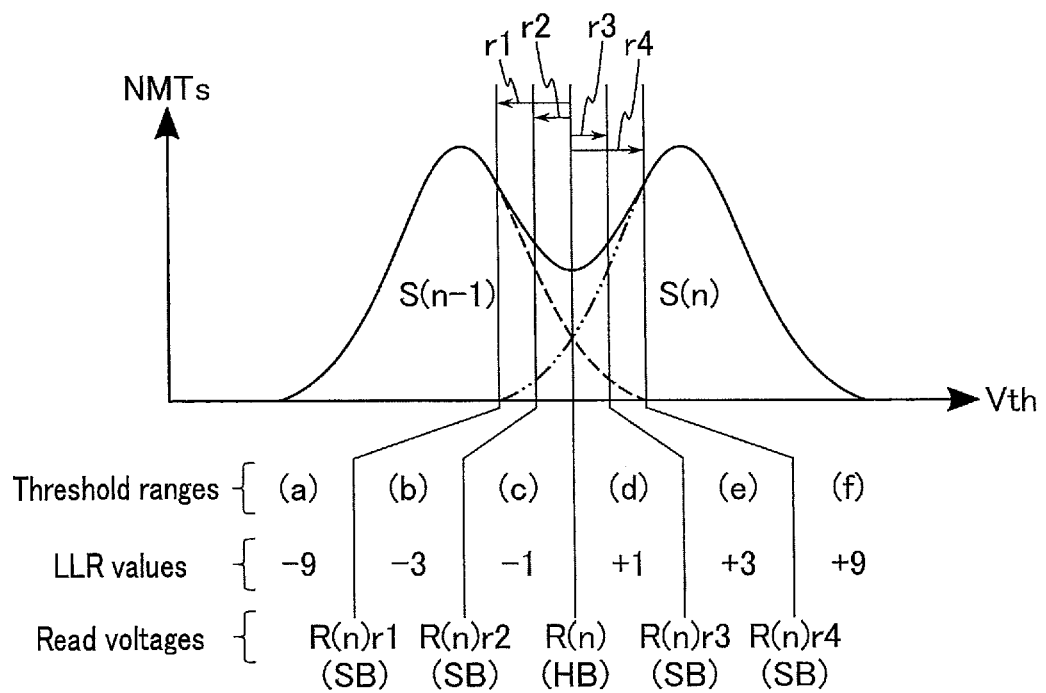
F I G. 6

| | Errors | Range | Example of setting of soft bit read voltage | Mutual information content |
|---|---|---|---|---|
| (1) | Small | Narrow | | Large |
| (2) | Small | Wide | | Small |
| (3) | Large | Narrow | | Small |
| (4) | Large | Wide | | Large |

| Inclination value IR | r1 | r2 |
|---|---|---|
| ~ 100 | −20 | −10 |
| 100 ~ 1000 | −10 | −5 |
| 1000 ~ | −4 | −2 |

(2)

| \|Inclination value IL\| | r3 | r4 |
|---|---|---|
| ~ 100 | +10 | +20 |
| 100 ~ 1000 | +5 | +10 |
| 1000 ~ | +2 | +4 |

263

F I G. 16

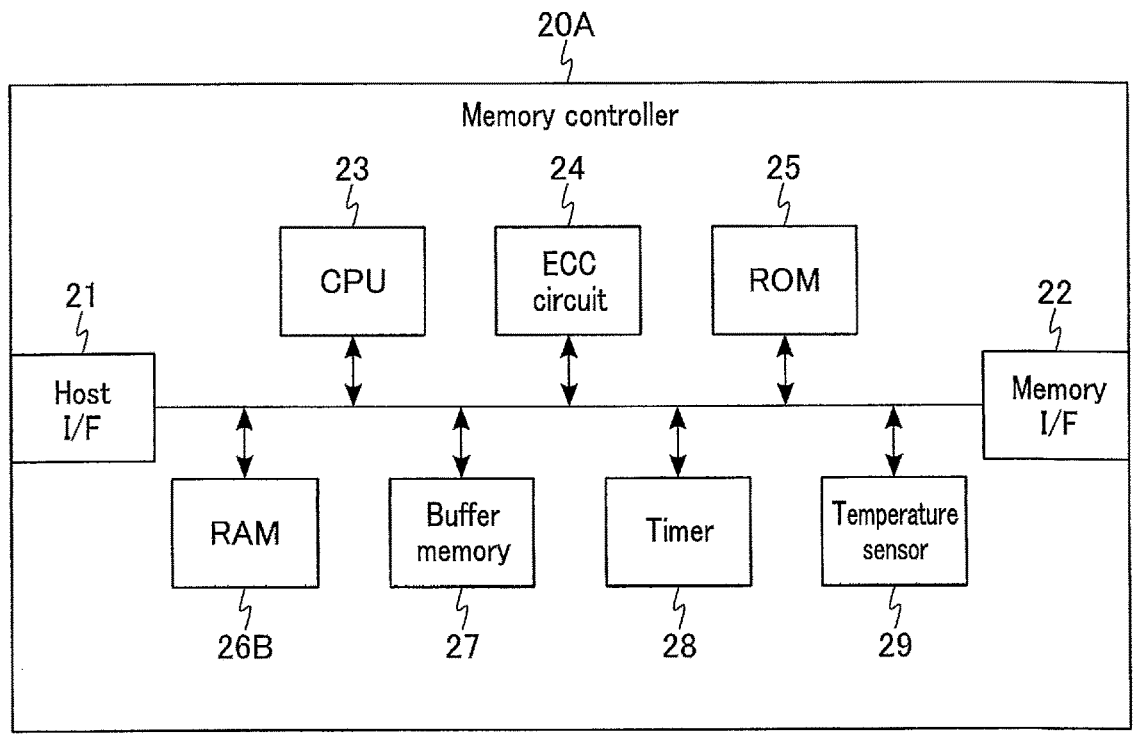
F I G. 18
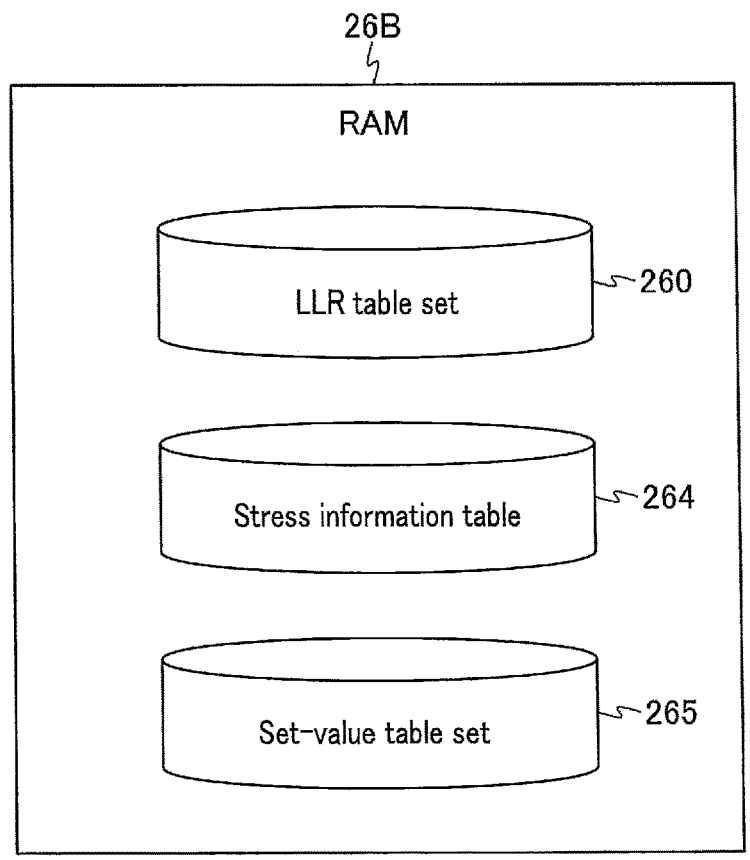
F I G. 19

264

| Address | Number of times of W/E | Write time | Number of reads | Write temperature |
|---|---|---|---|---|
| ... | ... | ... | ... | ... |
| ... | ... | ... | ... | ... |
| ... | ... | .. | ... | .. |
| ... | ... | ... | .. | ... |
| ... | ... | ... | ... | ... |
| ... | ... | ... | ... | .. |
| ... | ... | ... | ... | ... |

F I G. 20

265 {

(A)

| Number of times of W/E | S1 state | | | | S2 state | | | | S3 state | | | |
|---|---|---|---|---|---|---|---|---|---|---|---|---|
| | r1 | r2 | r3 | r4 | r1 | r2 | r3 | r4 | r1 | r2 | r3 | r4 |
| Small | ... | ... | ... | ... | ... | ... | ... | ... | ... | ... | ... | ... |
| Large | ... | ... | ... | ... | ... | .. | ... | ... | ... | ... | ... | ... |

(B)

| Stored time | S1 state | | | | S2 state | | | | S3 state | | | |
|---|---|---|---|---|---|---|---|---|---|---|---|---|
| | r1 | r2 | r3 | r4 | r1 | r2 | r3 | r4 | r1 | r2 | r3 | r4 |
| Small | ... | ... | ... | ... | ... | ... | ... | ... | ... | .. | ... | ... |
| Large | ... | ... | ... | ... | ... | ... | ... | ... | ... | ... | ... | ... |

(C)

| Number of reads | S1 state | | | | S2 state | | | | S3 state | | | |
|---|---|---|---|---|---|---|---|---|---|---|---|---|
| | r1 | r2 | r3 | r4 | r1 | r2 | r3 | r4 | r1 | r2 | r3 | r4 |
| Small | ... | ... | ... | ... | ... | ... | ... | ... | ... | ... | ... | ... |
| Large | ... | ... | ... | .. | ... | ... | ... | ... | ... | ... | ... | ... |

(D)

| Difference between write temperature and read temperature | S1 state | | | | S2 state | | | | S3 state | | | |
|---|---|---|---|---|---|---|---|---|---|---|---|---|
| | r1 | r2 | r3 | r4 | r1 | r2 | r3 | r4 | r1 | r2 | r3 | r4 |
| Small | ... | ... | ... | ... | ... | ... | ... | ... | ... | ... | ... | ... |
| Large | ... | ... | ... | .. | ... | ... | ... | ... | .. | ... | ... | ... |

FIG. 21

(1) Threshold voltage distributions immediately after writing
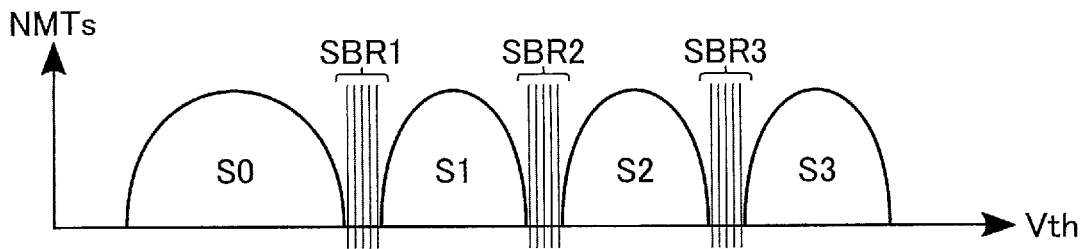
(2) The number of times of W/E increases
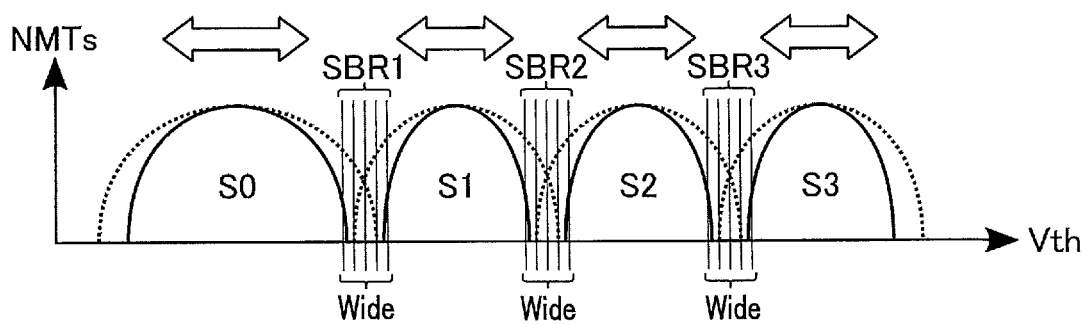
(3) Stored time is lengthened
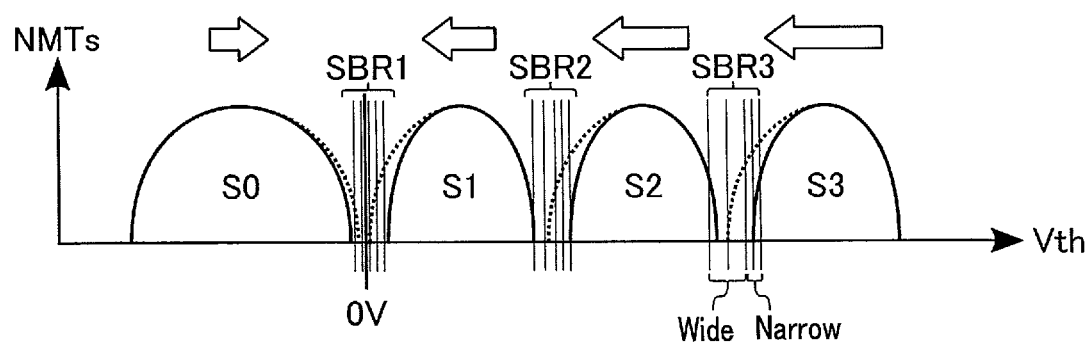
(4) The number of reads increases
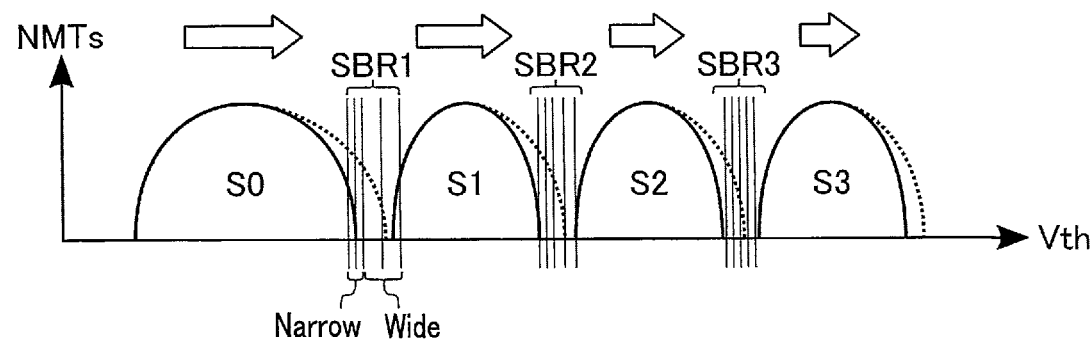
F I G. 23

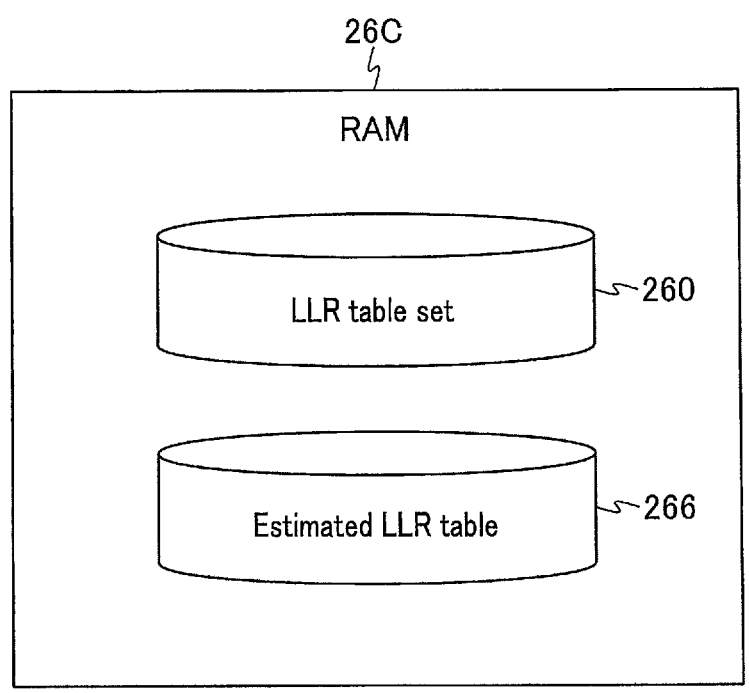
F I G. 24

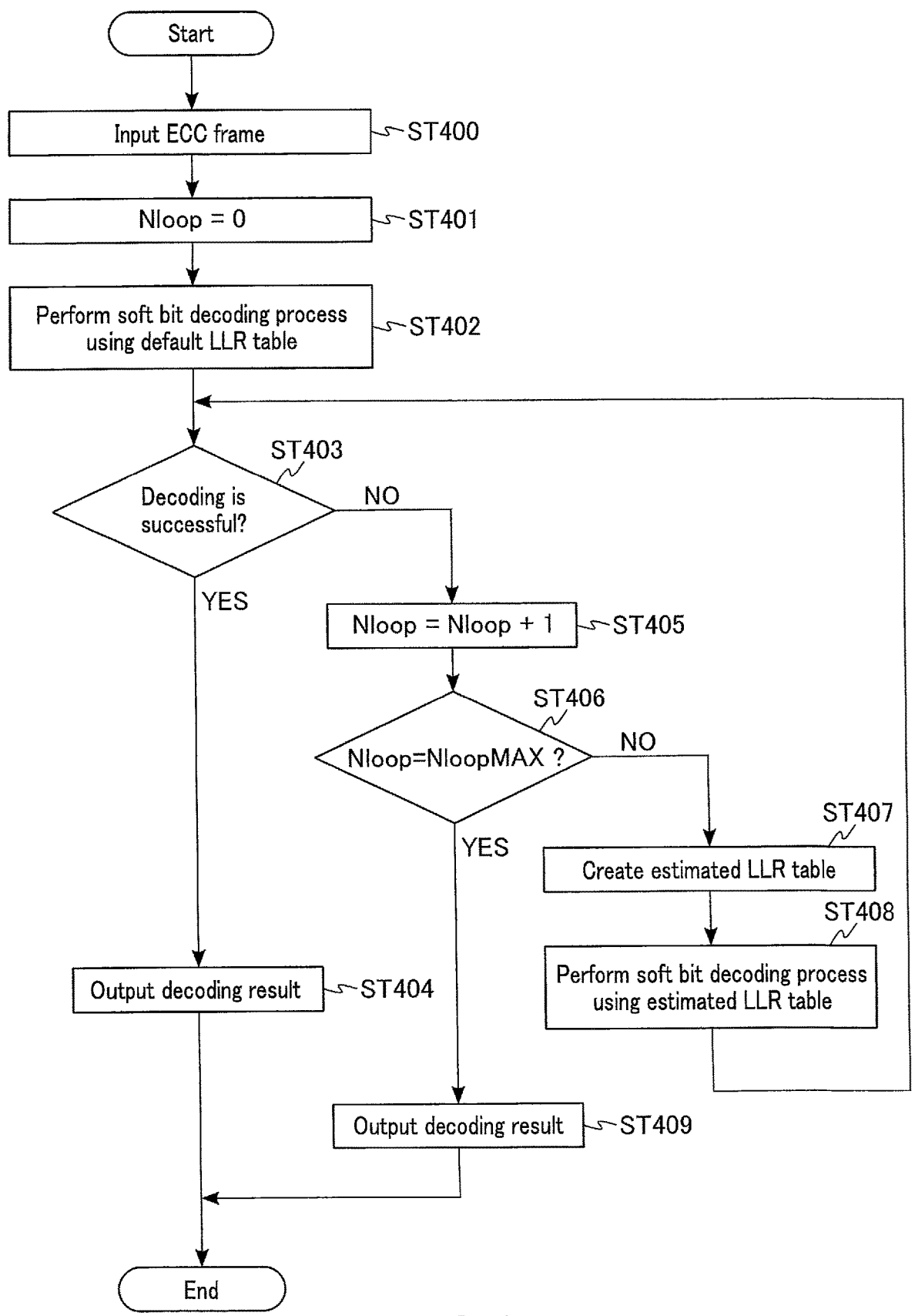
F I G. 25

MEMORY SYSTEM

CROSS-REFERENCE TO RELATED APPLICATION

This application is based upon and claims the benefit of priority from prior Japanese Patent Application No. 2021-154139, filed Sep. 22, 2021, the entire contents of which are incorporated herein by reference.

FIELD

Embodiments described herein relate generally to a memory system.

BACKGROUND

NAND flash memories capable of storing data nonvolatilely are known.

BRIEF DESCRIPTION OF THE DRAWING(S)

FIG. 1 is a block diagram showing an example of a configuration of an information processing system according to a first embodiment.

FIG. 2 is a schematic diagram showing an example of the threshold voltage distribution of memory cells, data allocation and read voltages in a memory system according to the first embodiment.

FIG. 5 is a block diagram showing an example of data stored in a RAM of the memory controller according to the first embodiment.

FIG. 6 is a schematic diagram showing an example of a threshold voltage distribution of adjacent states, setting of soft bit read voltages, and setting of LLR values in the memory system according to the first embodiment.

FIG. 7 is a table showing an example of a tendency of mutual information content in a soft bit decoding process.

FIG. 15 is a table showing a specific example of a second set-value table stored in the RAM of the memory controller according to the second embodiment.

FIG. 18 is a block diagram showing an example of a hardware configuration of a memory controller according to a third embodiment.

FIG. 19 is a block diagram showing an example of data stored in a RAM of the memory controller according to the third embodiment.

FIG. 20 is a table showing an example of a stress information table stored in the RAM of the memory controller according to the third embodiment.

FIG. 21 is tables each showing an example of a set-value table set stored in the RAM of the memory controller according to the third embodiment.

FIG. 23 is a schematic diagram showing an example of a method for setting soft bit read voltages in the memory system according to the third embodiment.

FIG. 24 is a block diagram showing an example of data stored in a RAM of a memory controller according to a fourth embodiment.

FIG. 25 is a flowchart showing an example of a soft bit decoding process of a memory system according to the fourth embodiment.

DETAILED DESCRIPTION

Figure 3:
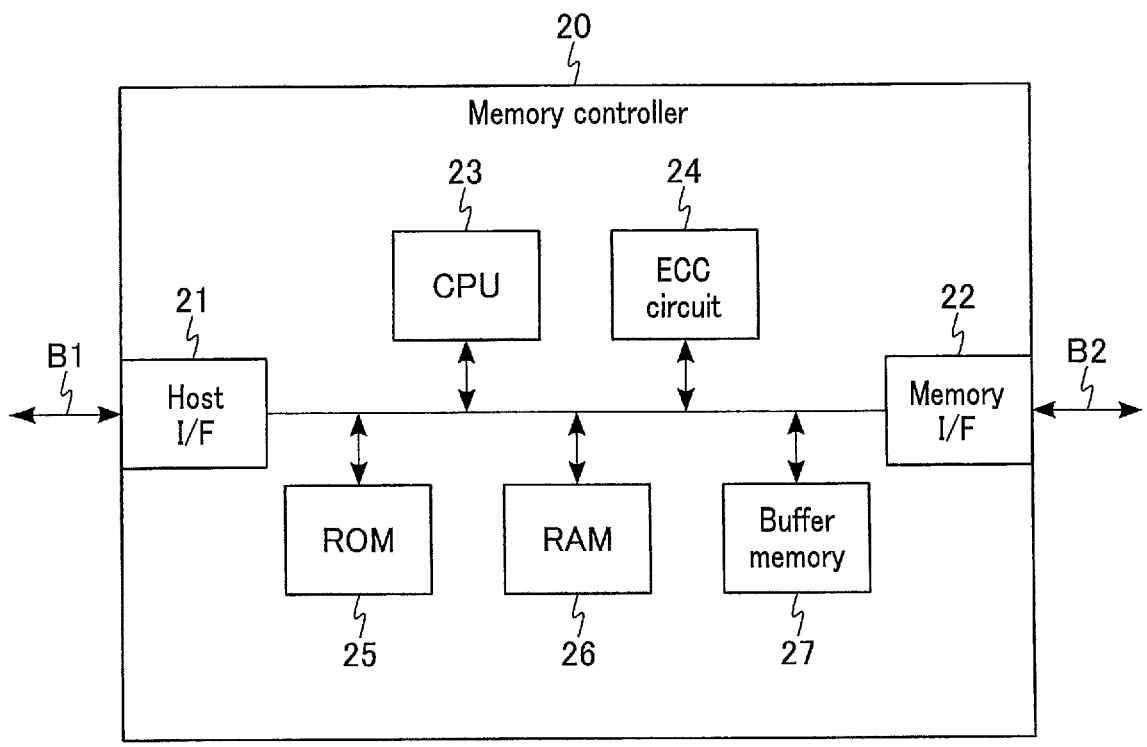
FIG. 3 is a block diagram showing an example of a hardware configuration of a memory controller according to the first embodiment.

In general, according to one embodiment, a memory system includes a nonvolatile memory and a memory controller. The nonvolatile memory includes a plurality of memory cells. The memory controller is configured to control the nonvolatile memory. In read operation for the memory cells, the memory controller is configured to: perform tracking including a plurality of reads in which a read voltage is shifted; determine a hard bit read voltage based on results of the tracking; calculate a soft bit read voltage based on the determined hard bit read voltage; perform soft bit read using the calculated soft bit read voltage; and perform a soft bit decoding process using a result of the soft bit read and a log-likelihood ratio table associated with the calculated soft bit read voltage.

Embodiments will be described below with reference to the accompanying drawings. In the embodiments, a device and a method for embodying the technical concept of the invention are exemplified. The drawings are schematic or conceptual. In the following descriptions, the elements having substantially the same function and configuration are denoted by the same numeral or sign. The number added to the numeral or sign is used to distinguish elements having the same configuration.

FIRST EMBODIMENT

A first embodiment will be described below.
[1-1] Configuration
[1-1-1] Configuration of Information Processing System
FIG. 1 is a block diagram showing an example of a configuration of an information processing system 1 according to the first embodiment. The information processing system 1 includes a host device HD and a memory system MS. The host device HD is an electronic device such as a personal computer, a portable information terminal and a server. The memory system MS is a storage medium such as a memory card and a solid state drive (SSD). The memory system MS includes a nonvolatile memory 10 and a memory controller 20. The host device HD and the memory controller 20 are connected to each other via a bus B1. The nonvolatile memory 10 and the memory controller 20 are connected to each other via a bus B2.

The nonvolatile memory 10 is a memory device that stores data nonvolatilely. The nonvolatile memory 10 is, for example, a NAND flash memory. The nonvolatile memory 10 includes a plurality of memory cells MC, a plurality of bit lines BL and a plurality of word lines WL. Each of the memory cells MC stores at least 1-bit data nonvolatilely. Each of the memory cells MC is associated with one bit line BL and one word line WL. Each of the memory cells MC is identified based on an address for identifying a word line WL and an address for identifying a bit line BL.

The memory controller 20 is a control device that controls the nonvolatile memory 10. The memory controller 20 is, for example, a semiconductor integrated circuit configured as a system on a chip (SoC). The memory controller 20 receives a command from the host device HD to control the nonvolatile memory 10 and perform a data read operation, a data write operation, a data erase operation and the like.

In the NAND flash memory, the data read and write unit is called "page" and the data erase unit is called "block." The block includes a plurality of pages. In the present specification, a set of memory cells MC connected to the same word line WL will be referred to as a "cell unit." The cell unit corresponds to the page. When each of the memory cells MC stores a plurality of items of bit data, the cell unit can store data of a plurality of pages.

[1-1-2] Threshold Voltage Distribution of Memory Cells MC

FIG. 2 is a schematic diagram showing an example of the threshold voltage distribution of memory cells MC, data allocation and read voltages in the memory system MS according to the first embodiment. In FIG. 2, NMTs represents the number of memory cells MC and Vth represents the height of the threshold voltages of the memory cells MC. Hereinafter, the threshold voltage distribution of memory cells MC each of which stores 2-bit data (2 bits/cell), data allocation and read voltages will be described with reference to FIG. 2.

The threshold voltage distribution indicates the distribution of threshold voltages of memory cells MC included in the cell unit. Each of the memory cells MC stores 2-bit data according to the height of the threshold voltages. In this example, the threshold voltage distribution includes an "S0" state, an "S1" state, an "S2" state and an "S3" state in ascending order of the threshold voltages. Different items of 2-bit data are allocated to their respective "S0" to "S3" states. Specifically, "11 (lower-order bit/higher-order bit)" data is allocated to the "S0" state. "10" data is allocated to the "S1" state. "00" data is allocated to the "S2" state. "01" data is allocated to the "S3" state. Hereinafter, a set of lower-order bit data stored in the cell unit will be referred to as "lower-order page data." A set of higher-order bit data stored in the cell unit will be referred to as "higher-order page data." A set of two adjacent states will be referred to as "adjacent states."

In read operation, the nonvolatile memory 10 applies a read voltage to a memory cell MC to determine a state including the memory cell MC. Then, the nonvolatile memory 10 supplies the memory controller 20 with the determination result as read data. The read voltage is set between adjacent states. For example, a read voltage R1 is set between the "S0" and "S1" states. A read voltage R2 is set between the "S1" and "S2" states. A read voltage R3 is set between the "S2" and "S3" states. When the nonvolatile memory 10 reads lower-order page data, it uses the read voltage R2 to determine whether the memory cell MC is included in a set of "S0" and "S1" states ("1" data) or a set of the "S2" and "S3" states ("0" data) (lower-order page reading). When the nonvolatile memory 10 reads higher-order page data, it uses the read voltages R1 and R3 to determine whether the memory cell MC is included in a set of "S0" and "S3" states ("1" data) or a set of the "S1" and "S2" states ("0" data) (higher-order page reading).

Hereinafter, a result of determining "0" or "1" by one read voltage set between adjacent states will be referred to as "a hard bit decoding value" or "a hard bit". The process of reading the hard bit from the cell unit will be referred to as "read". The read voltage used in the read will be referred to as "a hard bit read voltage". Each of the read voltages R1, R2 and R3 corresponds to the hard bit read voltage. A result read by a read voltage set with the hard bit read voltage as a reference and used for soft bit decoding to be described later will be referred to as "a soft bit decoding value" or "a soft bit". The process of reading the soft bit from the cell unit will be referred to as "soft bit read". The read voltage used in the soft bit read will be referred to as "soft bit read voltage". Note that the height of read voltages applied to the memory cells MC is controlled based on a digital to analog converter (DAC) value. The hard bit read voltage may be shifted from the reference read voltage. The height of the soft bit read voltage may be managed based on the amount of shift relative to the reference hard bit read voltage.

[1-1-3] Hardware Configuration of Memory Controller 20

FIG. 3 is a block diagram showing an example of the hardware configuration of the memory controller 20 according to the first embodiment. The memory controller 20 includes a host interface (host I/F) 21, a memory interface (memory I/F) 22, a central processing unit (CPU) 23, an error correction code (ECC) circuit 24, a read only memory (ROM) 25, a random access memory (RAM) 26 and a buffer memory 27.

The host I/F 21 is a hardware interface connected to the host device HD via the bus B2. The host I/F 21 performs communication that conforms to the interface standard between the host device HD and the memory controller 20. The interface standard supported by the host I/F 21 includes serial advanced technology attachment (SATA), PCI express (PCIe™) and the like.

The memory I/F 22 is a hardware interface connected to the nonvolatile memory 10 via the bus B1. The memory I/F 22 performs communication that conforms to the interface standard between the nonvolatile memory 10 and the memory controller 20. The interface standard supported by the memory I/F 22 is, for example, the NAND interface standard.

The CPU 23 is a processor. The CPU 23 controls the entire operation of the memory controller 20. The CPU 23 receives a write request via the host I/F 21 to instruct the nonvolatile memory 10 to write data via the memory I/F 22. The CPU 23 receives a read request via the host I/F 21 to instruct the nonvolatile memory 10 to read data via the memory I/F 22.

The ECC circuit 24 is a circuit that performs ECC processing. The ECC processing includes data coding and decoding. The ECC circuit 24 codes data to be written to the nonvolatile memory 10 and decodes data read from the nonvolatile memory 10. The coding system of the ECC circuit 24 includes Bose-Chaudhuri-Hocquenghem (BCH) coding, Reed-Solomon (RS) coding, low-density parity-check (LDPC) coding and the like. Hereinafter, the unit of data to be coded and encoded by the ECC circuit 24 will be referred to as "ECC frame." The ECC frame corresponds to one-page data, for example.

The ROM 25 is a nonvolatile memory. The ROM 25 is, for example, an electrically erasable programmable read-only Memory (EEPROM™). The ROM 25 stores programs such as firmware. For example, the operation of the memory controller 20, which will be described later, is performed by the CPU 23 executing the firmware of the ROM 25.

The RAM 26 is a volatile memory. The RAM 26 is, for example, a dynamic random access memory (DRAM) and a static random access memory (SRAM). The RAM 26 is used as a work area of the CPU 23. The RAM 26 stores a management table such as a lookup table that associates a logical address and a physical address with each other.

The buffer memory 27 is a volatile memory. The buffer memory 27 includes a dynamic random access memory (DRAM), a static random access memory (SRAM) and the like. The buffer memory 27 receives data via the host I/F 21 to temporarily store the data (hereinafter referred to as "write buffer data") and receives data via the memory I/F 22 to temporarily store the data.

[1-1-4] Hardware Configuration of ECC Circuit 24

Figure 4:
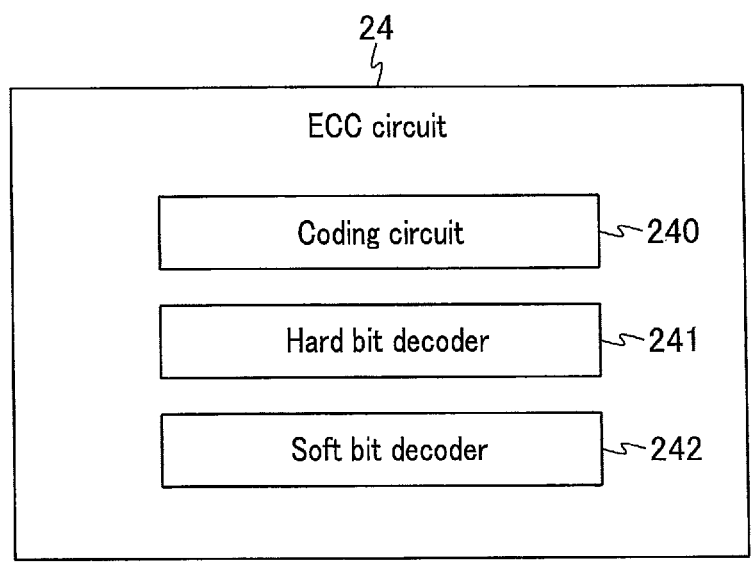
FIG. 4 is a block diagram showing an example of a hardware configuration of an ECC circuit of the memory controller according to the first embodiment.

FIG. 4 is a block diagram showing an example of a hardware configuration of the ECC circuit 24 of the memory controller 20 according to the first embodiment. The ECC circuit 24 includes a coding circuit 240, a hard bit decoder 241 and a soft bit decoder 242.

The coding circuit 240 is a semiconductor integrated circuit that codes a message. The message includes data received via the host I/F 21, system data of the memory controller 20 and the like. In write operation, the coding circuit 240 generates a code word from the message. This code word generation is also referred to as "coding". The code word is also called an ECC frame. The ECC frame includes an information section and a redundancy section. The information section is a message coded by the coding circuit 240. The redundancy section is also called an error correction code or parity.

The hard bit decoder 241 is a semiconductor integrated circuit that performs hard bit decoding for read data. The hard bit decoder 241 is supplied with an ECC frame read from the nonvolatile memory 10 with a hard bit value. Then, the hard bit decoder 241 decodes the read ECC frame. In decoding, the hard bit decoder 241 corrects an error of the read ECC frame using the parity of the read ECC frame.

The soft bit decoder 242 is a semiconductor integrated circuit that performs soft bit decoding for read data. The soft bit decoder 242 is supplied with an ECC frame read from the nonvolatile memory 10 with a soft bit value. Then, the soft bit decoder 242 decodes the read ECC frame. In decoding, the soft bit decoder 242 corrects an error of the read ECC frame using the parity of the read ECC frame and a log-likelihood ratio (LLR) table. The LLR table shows the correspondence between the soft bit values and the log-likelihood ratio.

[1-1-5] Structure of Data Stored in RAM 26

FIG. 5 is a block diagram showing an example of data stored in the RAM 26 of the memory controller 20 according to the first embodiment. The RAM 26 stores an LLR table set 260, setting limit information 261 and a first set-value table 262.

The LLR table set 260 includes a plurality of LLR tables. The LLR tables include an LLR table referenced by default and an LLR table referenced in association with the first set-value table 262. The LLR table includes a log-likelihood ratio (LLR) value. The LLR value is information representing the likelihood when the bit stored in the memory cell MC is "0" and the likelihood when it is "1" in a logarithmic ratio. The LLR value indicates the reliability (likelihood) of data read by a certain read voltage. The LLR value is assigned to each of the ranges into which the threshold voltage distribution of the memory cell MC is divided. Note that the success probability of decoding by soft bit decoding is higher than that of decoding by hard bit decoding. On the other hand, processing time of the soft bit decoding process is longer than that of the hard bit decoding process.

The setting limit information 261 is a table including information on the read voltage setting limit value used in the read operation. The read voltage setting limit value is set for each reference read voltage set between adjacent states, and indicates the lower limit or upper limit of read voltages usable in the read operation.

The first set-value table 262 stores set values of soft bit read voltages associated with the LLR table. The first set-value table 262 shows the correspondence between a difference between the set limit value of the hard bit read voltages and the hard bit read voltages and set values (or shift values (correction values)) of the soft bit read voltages. The set values of the soft bit read voltages are assigned to divisions obtained according to the difference between the set limit value of the read voltages and the hard bit read voltages.

[1-2] Operation

[1-2-1] Soft Bit Decoding Process

FIG. 6 is a schematic diagram showing an example of a threshold voltage distribution of adjacent states "S (n-1)" and "S (n) (n is an integer of 1 or more)", setting of soft bit read voltages, and setting of LLR values in the memory system according to the first embodiment.

In the actual threshold voltage distribution of the memory cell MC, the upper and lower tails of each state expand, and adjacent states may overlap each other. In the overlapped portions of the adjacent states, some data is detected as an error. The memory controller 20 executes a soft bit decoding process on data not decoded by the hard bit decoding process, for example. In soft bit decoding process, soft bit read is performed. The soft bit read includes a plurality of read operations for a valley portion of the threshold voltage distribution of adjacent states. In other words, the soft bit read includes one or more read operations using a read voltage set at a predetermined step size for a reference read voltage used in the read.

In the soft bit read for the valley portions of the "S (n-1)" and "S (n)" states, for example, read voltages R(n), R(n)r1, R(n)r2, R(n)r3 and R(n)r4 are used. R(n) is a read voltage (hard bit read voltage HB) set between adjacent states "S (n-1)" and "S (n)." R(n)r1, R(n)r2, R(n)r3 and R(n)r4 are read voltages (soft bit read voltages SB) shifted from R(n) by r1, r2, r3 and r4, respectively. Read voltages r1 and r2 have negative values, and r2 is larger than r1 (r1<r2). Read voltages r3 and r4 have positive values, and r4 is larger than r3 (r3<r4).

In this example, the adjacent states "S (n-1)" and "S (n)" are divided into six threshold ranges (a), (b), (c), (d), (e) and (f) by the read voltages R(n), R(n)r1, R(n)r2, R(n)r3 and R(n)r4. The threshold range (a) corresponds to a division that is lower than R(n)r1. The threshold range (b) corresponds to a division between R(n)r1 and R(n)r2. The threshold range (c) corresponds to a division between R(n)r2 and R(n). The threshold range (d) corresponds to a division between R(n) and R(n)r3. The threshold range (e) corresponds to a division between R(n)r3 and R(n)r4. The threshold range (f) corresponds to a division that is higher than R(n)r4.

LLR values −9, −3, −1, +1, +3 and +9 are assigned to the threshold ranges (a), (b), (c), (d), (e) and (f), respectively. The magnitude of the LLR values indicates the certainty of "0" data. Each of the threshold ranges indicates that as the LLR values are positive and their absolute values are larger, the percentage of bits of "0" data is large. Each of the threshold ranges indicates that as the LLR values are negative and their absolute values are larger, the percentage of bits of "1" data is larger. Each of the LLR tables stores an LLR value determined by, for example, prior evaluation for each setting of soft bit read voltage.

The LLR value of each threshold range is calculated by formula "1n[P(y|x=0)/P(y|x=1)]" in which y corresponds to a threshold range for which the LLR value is to be calculated, "x" corresponds to an ECC frame, and P(y|x=0) corresponds to the observation probability of memory cells MC of "0" data in the threshold range "y". That is, P(y|x=0) corresponds to a number obtained by dividing the number of memory cells MC of "0" data observed in the threshold range "y" by the total number of "0" data observed in all the threshold ranges. P(y|x=1) corresponds to the observation probability of memory cells MC of "1" data in the threshold range "y". That is, P(y|x=1) corresponds to a number obtained by dividing the number of memory cells MC of "1" data observed in the threshold range "y" by the total number of "1" data observed in all the threshold ranges.

In order to estimate the information written to the memory cells MC, it is preferable to set the threshold ranges and the LLR values appropriately to reduce uncertainty about the information written to the memory cells MC. In order to reduce the uncertainty, it is preferable to increase mutual information content. In hard bit decoding, a hard bit read voltage is set to minimize the number of error bits (i.e., fail bit counts) and thus maximize the mutual information content. On the other hand, in soft bit decoding, the mutual information content varies according to the setting of threshold ranges, that is, the setting range of soft bit read voltages. In other words, in soft bit decoding, the setting of the optimum soft bit read voltage to be used in soft bit read varies depending on the shape of the threshold voltage distribution.

FIG. 7 is a table showing an example of a tendency of mutual information content in the soft bit decoding process of the memory system MS according to the first embodiment. Specifically, FIG. 7 shows an example of the mutual information content regarding the combination of error amounts of the adjacent states "S (n-1)" and "S (n)" and the setting range SBR of soft bit read voltages.

As shown in (1) and (2) of FIG. 7, when the upper and bottom tails UT and BT of each state are inhibited from expanding, the overlap of adjacent states is decreased and so is the number of errors. In this case, when the setting range SBR is set narrowly, a soft bit read voltage is set to divide an overlapped portion of the adjacent states, thereby increasing the mutual information content ((1) in FIG. 7). On the other hand, the setting range SBR is set widely, a soft bit read voltage is set to divide a range that is wider than an overlapped portion of the adjacent states, thereby decreasing the mutual information content ((2) in FIG. 7).

As shown in (3) and (4) of FIG. 7, when the upper and bottom tails UT and BT of each state expand, the overlap of adjacent states is increased and so is the number of errors. In this case, when the setting range SBR is set narrowly, a soft bit read voltage is set to divide a range that is narrower than an overlapped portion of the adjacent states, thereby decreasing the mutual information content ((3) in FIG. 7). On the other hand, the setting range SBR is set widely, a soft bit read voltage is set to divide an overlapped portion of the adjacent states, thereby increasing the mutual information content ((4) in FIG. 7).

In order to increase the mutual information amount, it is preferable to increase the number of soft bit read voltages used in the soft bit read and to set an appropriate soft bit read voltage. However, the number of soft bit reads is fixed according to the design of the soft bit decoder 242. The first embodiment thus focuses on optimizing the soft bit read voltage in order to increase the mutual information content. In this case, in order to increase the mutual information content, it is preferable to determine the soft bit read voltage to divide each of the upper tail UT of the "S (n-1)" state and the bottom tail BT of the "S (n)" state according to the shape of the threshold voltage distribution.

[1-2-2] Read Operation

Figure 8:
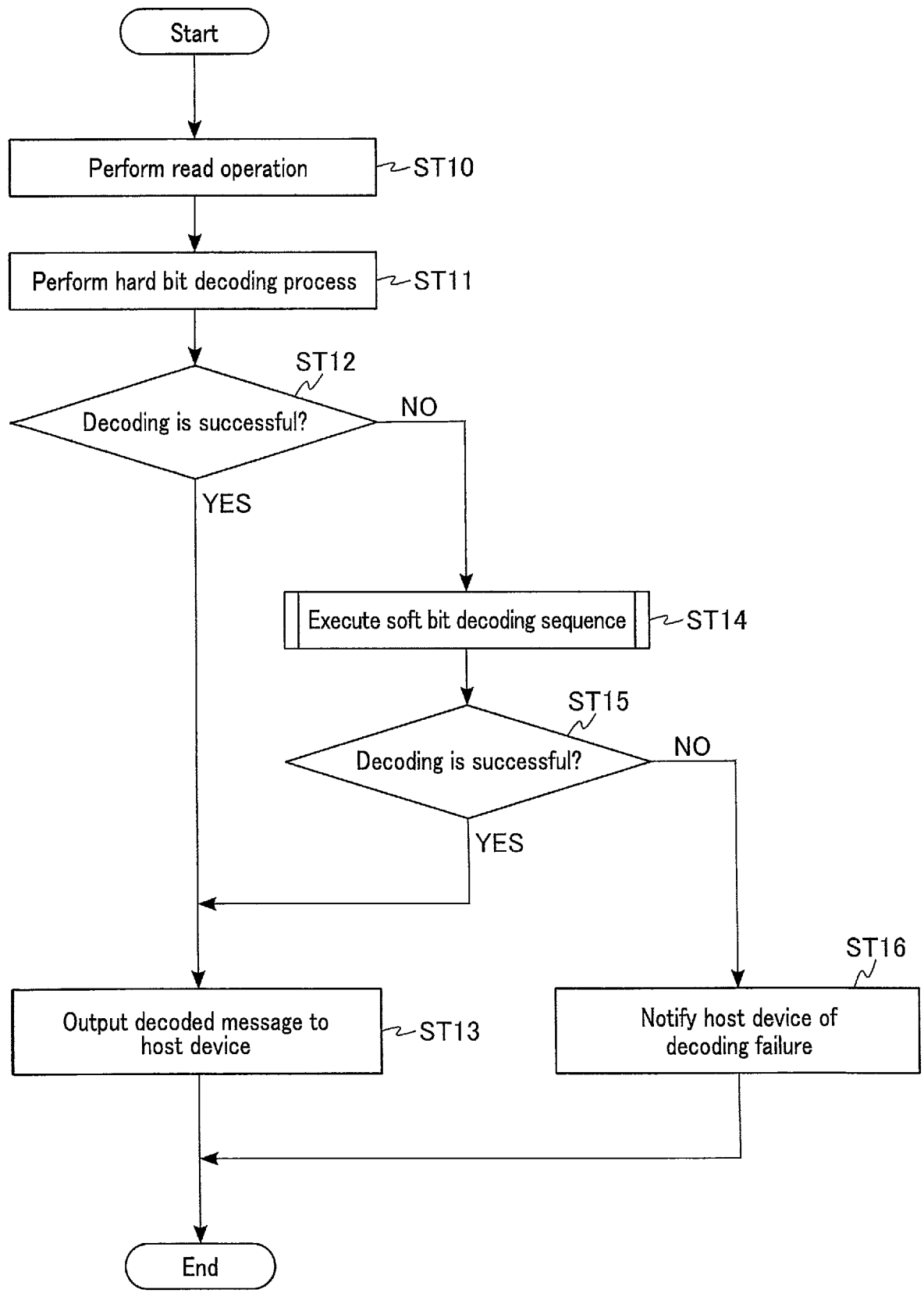
FIG. 8 is a flowchart showing an outline of a read operation of the memory system according to the first embodiment.

FIG. 8 is a flowchart showing an outline of the read operation of the memory system MS according to the first embodiment. The outline of the read operation of the memory system MS will be described below with reference to FIG. 8.

Upon receipt of a read request from the host device HD, the memory controller 20 starts a read operation (Start) and performs the read operation (ST10). In the read operation, the memory controller 20 transmits a command set including the read request and the information of an address designated by the read request to the nonvolatile memory 10. Based on the contents of the received command set, the nonvolatile memory 10 reads data from the cell unit of the designated address and transmits the read data to the memory controller 20. Then, the memory controller 20 causes the buffer memory 27 to store the data (ECC frame) received from the nonvolatile memory 10.

The memory controller 20 performs a hard bit decoding process (ST11). Specifically, the hard bit decoder 241 decodes the ECC frame using parity included in the ECC frame stored in the buffer memory 27.

The memory controller 20 checks whether the ECC frame has been successfully decoded as a result of the hard bit decoding process in ST11 (ST12).

If the memory controller 20 has confirmed in the process of ST12 that the ECC frame is successfully decoded (Yes in ST12), it outputs a decoded message to the host device HD (ST13).

When the process of ST13 is completed, the memory controller 20 terminates a series of steps shown in FIG. 8 (End).

If the memory controller 20 has confirmed in the process of ST12 that the ECC frame is not successfully decoded (No in ST12), it executes a soft bit decoding sequence (ST14). The soft bit decoding sequence includes soft bit read and a soft bit decoding process. The soft bit decoding sequence will be described in detail later.

When the process of ST14 is completed, the memory controller 20 confirms whether the ECC frame has been decoded successfully as a result of the soft bit decoding process included in ST14 (ST15).

If the memory controller 20 has confirmed in the process of ST15 that the ECC frame is successfully decoded (Yes in ST15), it proceeds to the process of ST13.

If the memory controller 20 has confirmed in the process of ST15 that the ECC frame is not successfully decoded (No in ST15), it notifies the host device HD of a decoding failure (ST15).

When the process of ST15 is completed, the memory controller 20 terminates a series of steps shown in FIG. 8 (End).

(Soft Bit Decoding Sequence)

Figures 9, 10:
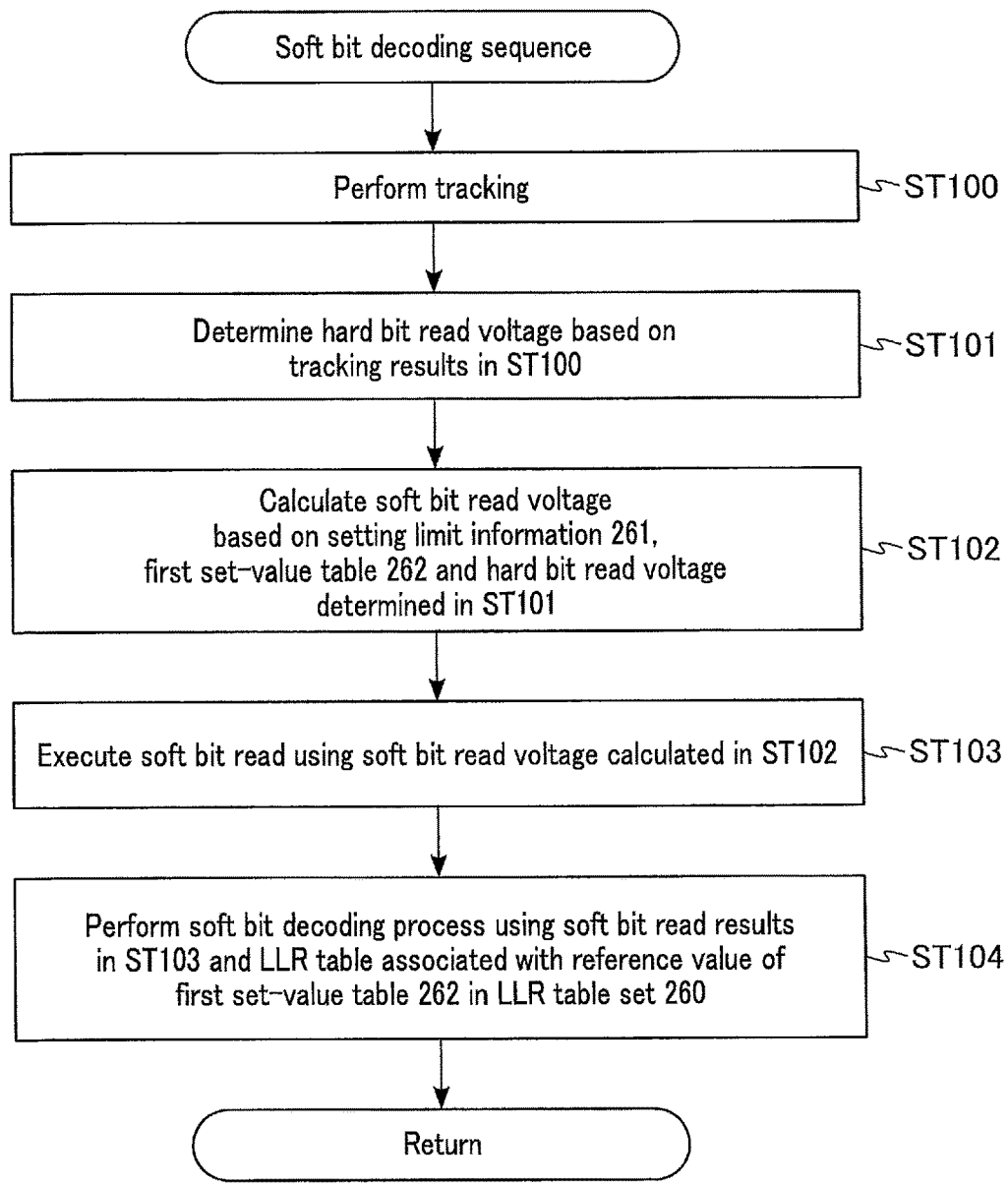
FIG. 9 is a flowchart showing an example of a soft bit decoding sequence of the memory system according to the first embodiment.
FIG. 10 is a table showing a specific example of a first set-value table stored in the RAM of the memory controller according to the first embodiment.

FIG. 9 is a flowchart showing an example of the soft bit decoding sequence of the memory system MS according to the first embodiment. The soft bit decoding sequence will be described below with reference to FIG. 9.

When the memory controller 20 starts a soft bit decoding sequence (ST14 in FIG. 8), it performs tracking (ST100). The tracking is an operation for searching for (or calculating) an appropriate shift value of a hard bit read voltage. The tracking includes a plurality of reads in which read voltages are shifted. The results of a plurality of reads read by the tracking (tracking read results) are stored in the buffer memory 27.

Based on the tracking results in ST100, the memory controller 20 determines a hard bit read voltage (ST101). Specifically, the memory controller 20 searches the tracking results for a voltage that minimizes the number of fail bits in the hard bit decoding process or a voltage that enables decoding through the hard bit decoding process. In other words, the memory controller 20 uses the tracking results to search (calculate) valley portions of adjacent states for an appropriate shift value of the hard bit read voltage. Note that the memory controller 20 may count the number of on-cells (the number of memory cells MC that are turned on) at each read voltage used for the tracking. In this case, the memory controller 20 can estimate the shape of the threshold voltage distribution of the memory cells MC based on variations in the number of on-cells to detect valley portions of adjacent states.

The memory controller 20 calculates a soft bit read voltage based on the setting limit information 261, the first set-value table 262 and the hard bit read voltage determined in ST101 (ST102). A specific example of a method for calculating a soft bit read voltage in ST102 will be described later.

The memory controller 20 executes soft bit read using the soft bit read voltage calculated in ST102 (ST103). Accordingly, the results of a plurality of soft bit reads read by their respective soft bit read voltages (soft bit read results) are stored in the buffer memory 27, for example.

The memory controller 20 performs a soft bit decoding process using the soft bit read results in ST103 and the LLR table associated with the reference value of the first set-value table 262 in the LLR table set 260 (ST104). The "reference value of the first set-value table 262" corresponds to a value of the first set-value table 262 referenced in the calculation of the soft bit read voltage in ST102.

When the process of ST104 is completed, the memory controller 20 terminates a series of steps shown in FIG. 9 (Return).

[1-2-3] Specific Example of Setting of Soft Bit Decoding Process

Below is a description of a specific example of setting a soft bit decoding process in the memory system MS according to the first embodiment.

(First Set-Value Table 262)

FIG. 10 is a table showing a specific example of the first set-value table 262 stored in the RAM 26 of the memory controller 20 according to the first embodiment. The first set-value table 262 shows the shift amount of the soft bit read voltage corresponding to the magnitude of "R(n) Limit—R(n)." R(n) corresponds to the hard bit read voltage determined based on the tracking results. "R(n) Limit" corresponds to the set lower limit value of R(n). That is, "R(n) Limit—R(n)" indicates a difference between R(n) and the set lower limit value of R(n) as a DAC value. Each of r1, r2, r3 and r4 represents a shift value of the soft bit read voltage shown in FIG. 6 as a DAC value. Note that the numerical values of the DAC values shown below are only examples.

When "R(n) Limit—R(n)" is less than −11 (first condition), that is, when R(n) is close to the set lower limit value, r1, r2, r3 and r4 are −10, −5, +10 and +20, respectively. Under the first condition, the intervals between shift values set in the negative direction are equal and the intervals between shift values set in the positive direction are equal, with reference to R(n). Furthermore, under the first condition, the interval between shift values set in the negative direction is narrower than the interval between shift values set in the positive direction with reference to R(n). That is, the soft bit read voltages calculated under the first condition are set asymmetrically with regard to R(n).

When "R(n) Limit—R(n)" is equal to or more than −11 and less than +50 (second condition), that is, when R(n) is away from each of the set lower and upper limit values, r1, r2, r3 and r4 are −20, −10, +10 and +20, respectively. Under the second condition, the intervals between shift values set in the negative direction are equal and the intervals between shift values set in the positive direction are equal, with reference to R(n). Furthermore, under the second condition, the interval between shift values set in the negative direction is equal to the interval between shift values set in the positive direction with reference to R(n). That is, the soft bit read voltages calculated under the second condition are set symmetrically with regard to R(n).

When "R(n) Limit—R(n)" is +50 or more (third condition), that is, when R(n) is close to the set upper limit value, r1, r2, r3 and r4 are −20, −10, +5 and +10, respectively. Under the third condition, the intervals between shift values set in the negative direction are equal and the intervals between shift values set in the positive direction are equal, with respect to R(n). Under the third condition, the interval between shift values set in the positive direction is smaller than the interval between shift values set in the negative direction with reference to R(n). That is, the soft bit read voltages calculated under the third condition are set asymmetrically with regard to R(n).

(Soft Bit Read Voltages and LLR Values in First Embodiment)

Figure 11:
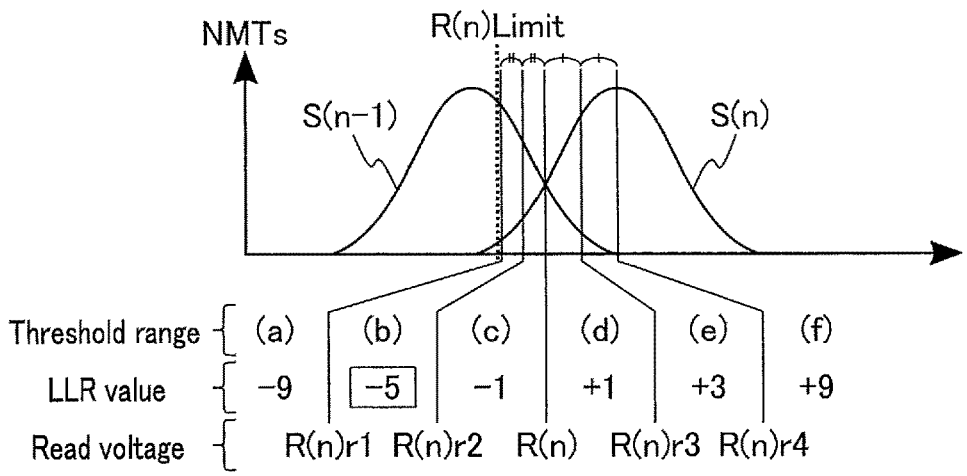
FIG. 11 is a schematic diagram showing a specific example of setting of soft bit read voltages and LLR values in the first embodiment.
Figure 11:
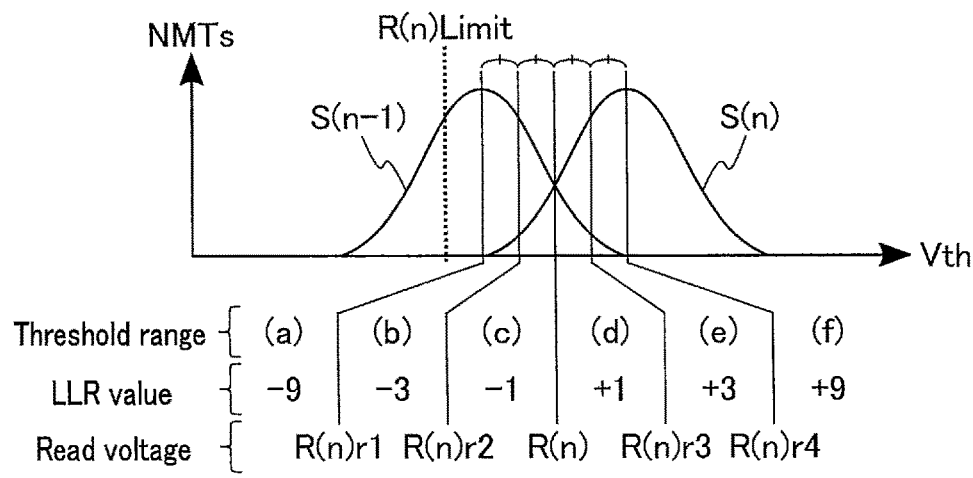
Figure 11:
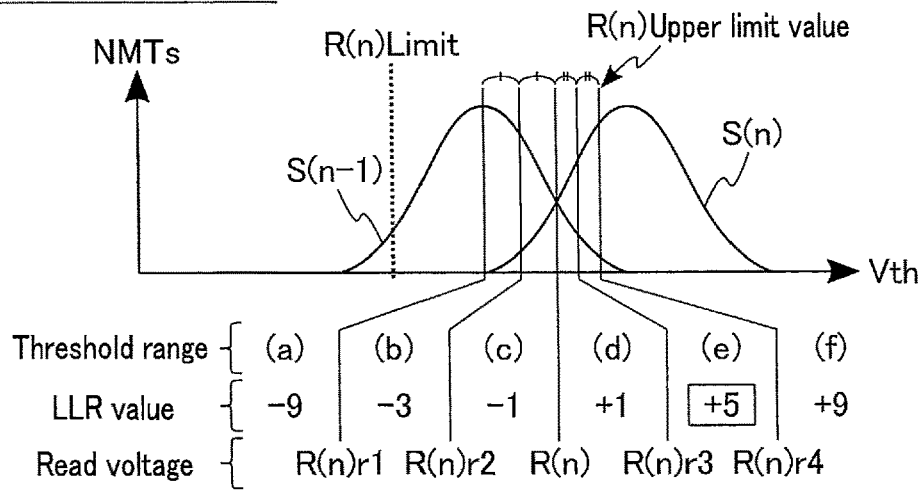

FIG. 11 is a schematic diagram showing a specific example of setting soft bit read voltages and LLR values in the first embodiment. In FIGS. 11, (1), (2) and (3) each show the threshold voltage distributions of adjacent states "S (n-1)" and "S (n)", and setting examples of threshold ranges, LLR values and read voltages under different conditions in the first embodiment.

In FIG. 11, (1) shows an example of setting soft bit read voltages and LLR values when "R(n) Limit-R(n)" is smaller than −11, that is, when the first condition is satisfied. In this example, R(n)r1 is changed to a voltage equal to or greater than R(n) Limit and less than R(n)r2 due to the limitation of the set lower limit value of R(n), that is, the limitation of R(n) Limit. R(n)r2 is set to divide R(n)r1 and R(n) at equal intervals. In this case, among the threshold ranges between the soft bit read voltages set between adjacent states, threshold ranges (b) and (c) set in the negative direction are equally spaced with reference to R(n) and threshold ranges (d) and (e) set in the positive direction are equally spaced with reference to R(n). On the other hand, each of the threshold ranges (b) and (c) is narrower than each of the threshold ranges (d) and (e). A default value (for example, the LLR value shown in FIG. 6) is assigned as an LLR value of each of the threshold ranges (a), (c), (d), (e) and (f). On the other hand, as the LLR value of the threshold range (b), a value optimized for the threshold range (b) under the first condition (for example, −5) is assigned. Note that the LLR values of the threshold ranges (a), (c), (d), (e) and (f) may be changed as the LLR value of the threshold range (b) is changed.

In FIG. 11, (2) shows an example of setting soft bit read voltages and LLR values when "R(n) Limit-R(n)" is equal to or larger than −11 and smaller than +50, that is, when the second condition is satisfied. In this example, neither of R(n)r1 to R(n)r4 is affected by the set lower limit value or the set upper limit value. In this case, the threshold ranges (b), (c), (d) and (e) between the soft bit read voltages set between adjacent states are equally spaced. A default value (for example, the LLR value shown in FIG. 6) is assigned as an LLR value of each of the threshold ranges (a), (b), (c), (d), (e) and (f).

In FIG. 11, (3) shows an example of setting soft bit read voltages and LLR values when "R(n) Limit-R(n)" is equal to or larger than +50, that is, when the third condition is satisfied. In this example, R(n)r4 is affected by the set upper limit value of R(n) (R(n) upper limit value). R(n)r3 is set to divide R(n) and R(n)r4 into equal intervals. In this case, among the threshold ranges between the soft bit read voltages set between adjacent states, the threshold ranges (b) and (c) set in the negative direction are equally spaced with respect to R(n) and the threshold ranges (d) and (e) set in the positive direction are equally spaced. On the other hand, each of the threshold ranges (d) and (e) is narrower than each of the threshold ranges (b) and (c). A default value (for example, the LLR value shown in FIG. 6) is assigned as an LLR value of each of the threshold ranges (a), (b), (c), (d) and (f). On the other hand, as the LLR value of the threshold range (e), a value optimized for the threshold range (e) under the third condition (for example, +5) is assigned. The LLR values of the threshold ranges (a), (c), (d), (e) and (f) may be changed as the LLR value of the threshold range (e) is changed.

[1-3] Advantageous Effects of First Embodiment

The memory system MS according to the first embodiment dynamically optimizes the soft bit read voltage in accordance with the setting limit value. As a result, the memory system MS according to the first embodiment can increase information (mutual information content) that is useful for soft bit decoding and can improve the success probability of decoding.

[2] Comparative Example

A comparative example will be described below.

[2-1] Soft Bit Read Voltage and LLR Value in Comparative Example

Figure 12:
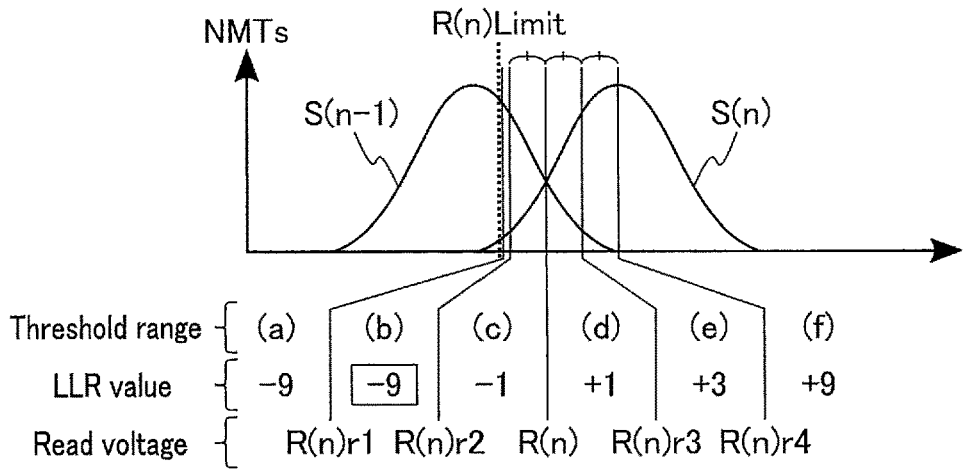
FIG. 12 is a schematic diagram showing a specific example of setting of soft bit read voltages and LLR values in a comparative example.
Figure 12:
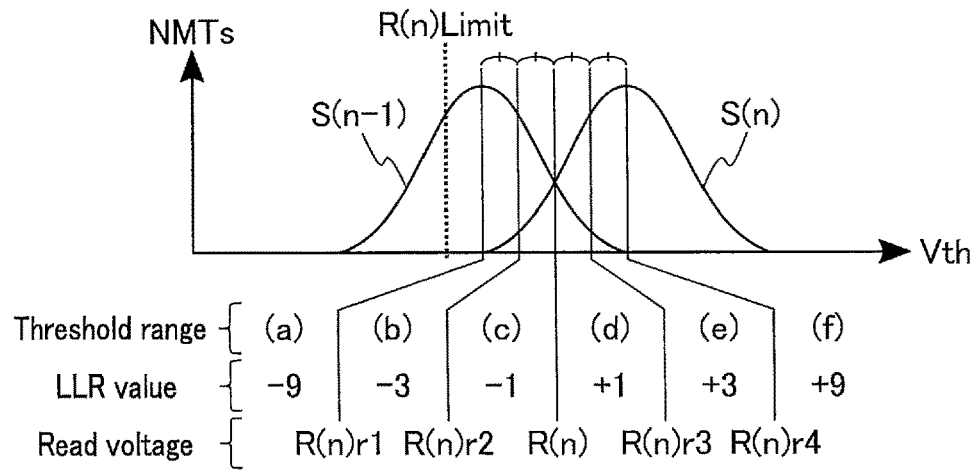
Figure 12:
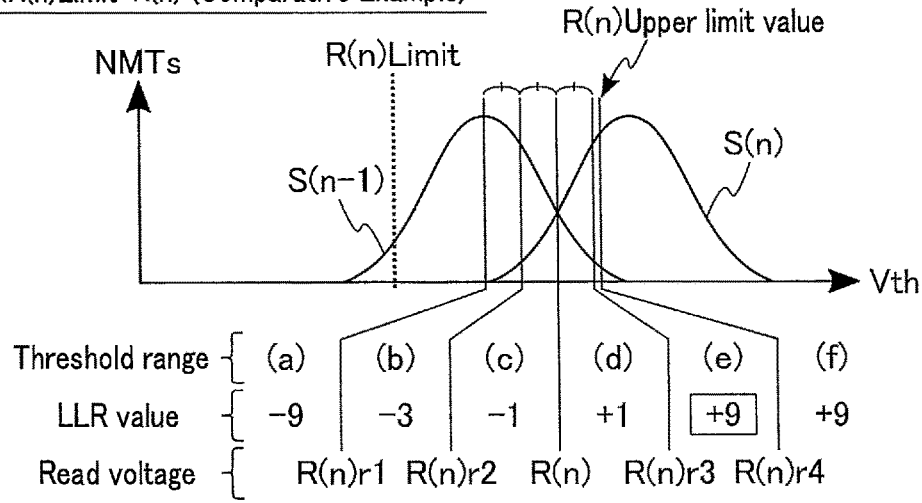

FIG. 12 is a schematic diagram showing a specific example of setting a soft bit read voltage and an LLR value in the comparative example. In the comparative example, a soft bit read voltage obtained by adding a fixed offset to a hard bit read voltage R(n) is used in the soft bit read. Furthermore, the intervals between shift values in the positive and negative directions are set equal with reference to R(n). When R(n) approaches the set lower or upper limit value, the soft bit read voltage is changed to a voltage based on the set lower or upper limit value. In FIGS. 12, (1), (2) and (3) each show threshold voltage distributions of adjacent states "S (n-1)" and "S (n)" and examples of setting threshold ranges, LLR values and read voltages under different conditions in the comparative example.

In FIG. 12, (1) shows an example of setting soft bit read voltages and LLR values when "R(n) Limit-R(n)" is smaller than −11, that is, when the voltage R(n) is close to the set lower limit value. In this example, R(n)r1 is changed to a voltage equal to or higher than R(n) Limit and lower than R(n)r2 due to the limitation of the set lower limit value of R(n), that is, the limitation of R(n) Limit. In this case, among the threshold ranges between the soft bit read voltages set between adjacent states, the threshold ranges (c), (d) and (e) are equal. On the other hand, the threshold range (b) is narrower than each of the threshold ranges (c), (d) and (e). A default value (for example, the LLR value shown in FIG. 6) is assigned as an LLR value of each of the threshold ranges (a), (c), (d), (e) and (f). On the other hand, as the LLR value of the threshold range (b), for example, the same value (likelihood) as the threshold range (a) is assigned.

In FIG. 12, (2) shows an example of setting soft bit read voltages and LLR values when "R(n) Limit-R(n)" is equal to or more than −11 and less than +50, that is, when R(n) is away from each of the set lower and upper limit values. In this example, neither of R(n)r1 to R(n)r4 is affected by the set lower and upper limit values. In this case, the threshold ranges (b), (c), (d) and (e) between the soft bit read voltages set between adjacent states are equal. A default value (for example, the LLR value shown in FIG. 6) is assigned as an LLR value of each of the threshold ranges (a), (b), (c), (d), (e) and (f).

In FIG. 12, (3) shows an example of setting soft bit read voltages and LLR values when "R(n) Limit-R(n)" is equal to or more than +50, that is, when R(n) is close to the set upper limit value. In this example, R(n)r4 is changed to a voltage that is lower than R(n)r4 in (2) of FIG. 12 due to the limitation of the set upper limit value (upper limit value of R(n)) of R(n). In this case, among the threshold ranges between the soft bit read voltages set between adjacent states, the threshold ranges (b), (c), and (d) are equal. On the other hand, the threshold range (e) is narrower than each of the threshold ranges (b); (c) and (d). A default value (for example, the LLR value shown in FIG. 6) is assigned as an LLR value of each of the threshold ranges (a), (b), (c), (d) and (f). On the other hand, as the LLR value of the threshold range (e), for example, the same value (likelihood) as the threshold range (f) is assigned.

[2-2] Advantageous Effects of Comparative Example

In the soft bit read of the comparative example, a soft bit read voltage obtained by adding a fixed offset to the hard bit read voltage is used. Therefore, in the comparative example, the mutual information content in the threshold range affected by the set limit value decreases, as does the success probability of decoding.

[3] Second Embodiment

A second embodiment will be described below. The memory system MS according to the second embodiment has a configuration in which data stored in the RAM 26 is changed in the memory system MS according to the first embodiment. The memory system MS according to the second embodiment uses soft bit read voltages and LLR values in which the shape of a threshold voltage distribution is considered in the soft bit decoding process.

[3-1] Structure of Data Stored in RAM 26A

Figure 13:
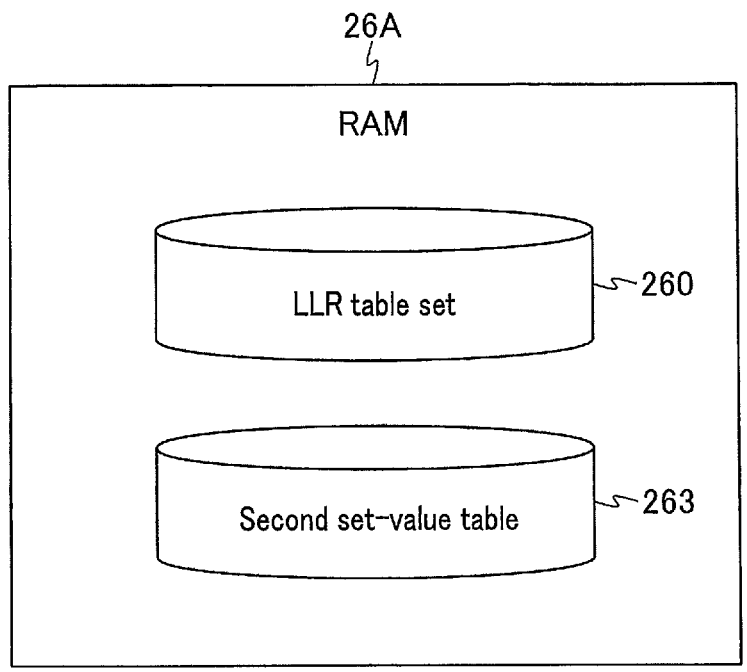
FIG. 13 is a block diagram showing an example of data stored in a RAM of a memory controller according to a second embodiment.

FIG. 13 is a block diagram showing an example of data stored in a RAM 26A of a memory controller 20 according to the second embodiment. The RAM 26A stores an LLR table set 260 and a second set-value table 263.

The configuration of the LLR table set 260 is similar to that in the first embodiment. The second set-value table 263 stores the set values of soft bit read voltages corresponding to inclination values IL and IR calculated based on the shape of the threshold voltage distribution. The second set-value table 263 shows the correspondence between the absolute value of the inclination value IL and the shift value of the soft bit read voltage in the positive direction. The second set-value table 263 also shows the correspondence between the inclination value IR and the shift value of the soft bit read voltage in the negative direction.

[3-2] Operation

[3-2-1] Method of Calculating Inclination Values IL and IR

Figure 14:
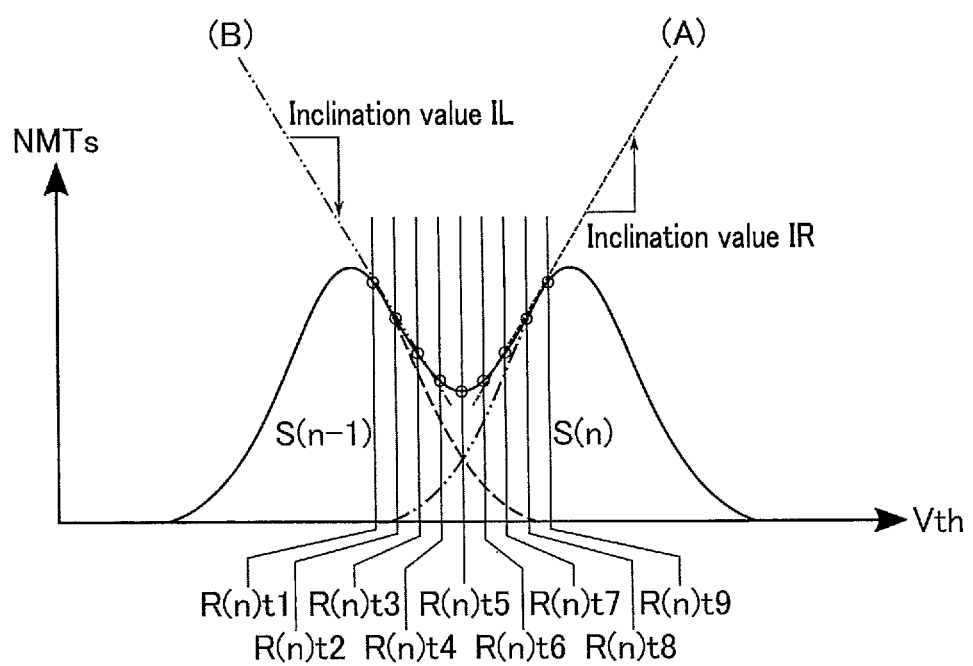
FIG. 14 is a schematic diagram showing an example of a method for calculating inclination values in a memory system according to the second embodiment.

FIG. 14 is a schematic diagram showing an example of a method for calculating inclination values IL and IR in the memory system according to the second embodiment. FIG. 14 illustrates threshold voltage distributions and read voltages when tracking is performed for valley portions of adjacent states "S (n-1)" and "S (n)."

In this example, the memory controller 20 executes a plurality of tracking reads for the valley portions of adjacent states "S (n-1)" and "S (n)" using read voltages R(n) t1, R(n) t2, R(n) t3, R(n) t4, R(n) t5, R(n) t6, R(n) t7, R(n) t8 and R(n) t9. The read voltages have the following relationship in strength: R(n) t1<R(n) t2<R(n) t3<R(n) t4<R(n) t5<R(n) t6<R(n) t7<R(n) t8<R(n) t9.

The memory controller 20 counts the number of on-cells for each read executed in the tracking read. For example, the amount of change in the number of on-cells has a negative value based on the respective read results of R(n) t1 to R(n) t4 and has a positive value based on the respective read results of R(n) t6 to R(n) t9. Thus, the memory controller 20 can estimate the shapes of the threshold voltage distributions of adjacent states "S (n-1)" and "S (n)" and can detect that the vicinity of R(n) t5 corresponds to the valley portions of the adjacent states "S (n-1)" and "S (n)."

Then, the memory controller 20 calculates inclination values IL and IR from the tracking read results. For example, the memory controller 20 calculates inclination value IL using the read results (for example, R(n) t1 to R(n) t4) in which the amount of change in the number of on-cells is negative. Similarly, the memory controller 20 calculates inclination value IR using the read results (for example, R(n) t6 to R(n) t9) in which the amount of change in the number of on-cells is positive. Note that the range and combination of read results referred to for the calculation of the inclination values IL and IR may be replaced by others.

[3-2-2] Soft Bit Decoding Sequence

Figure 15:
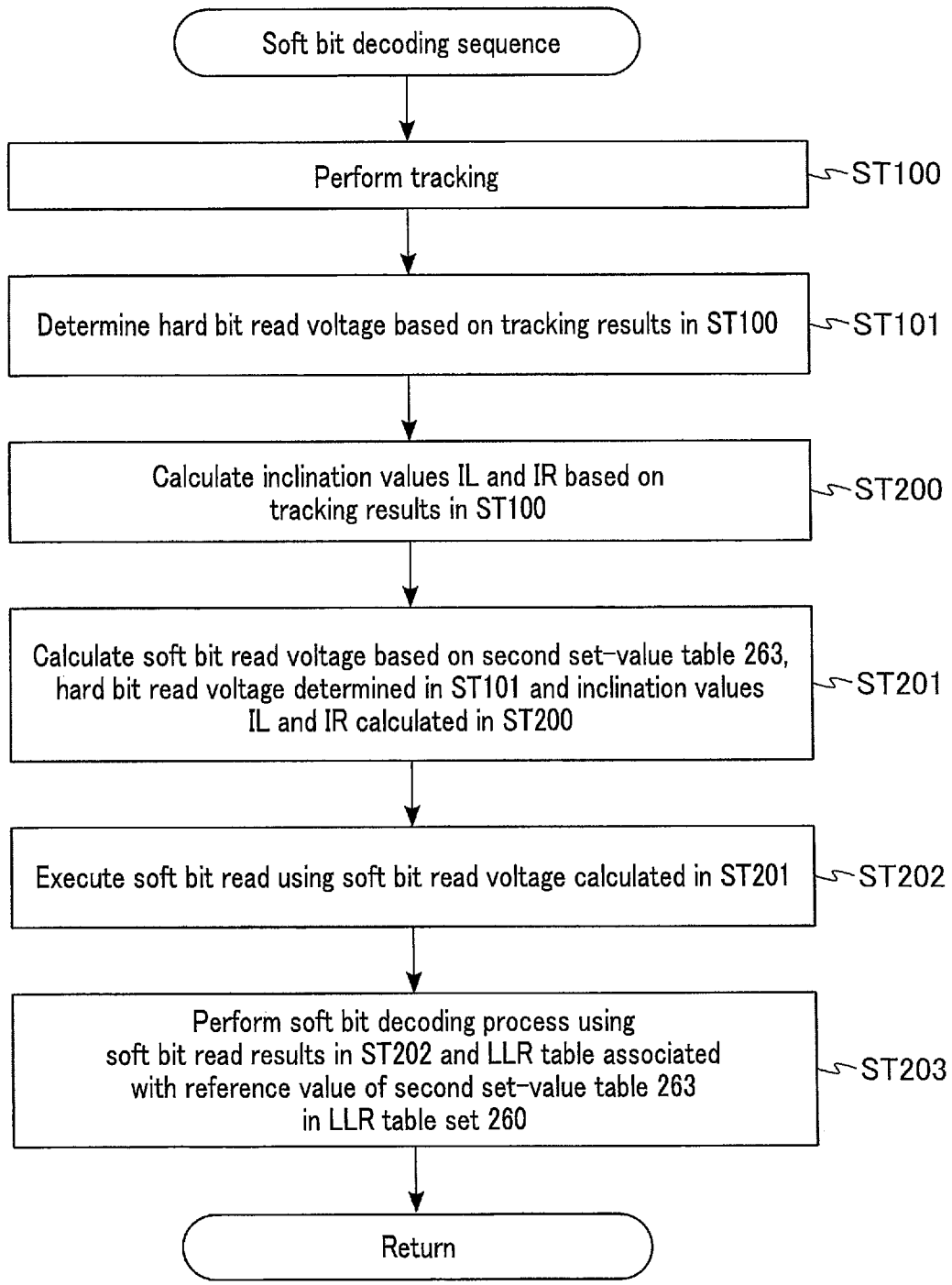
FIG. 15 is a flowchart showing an example of a soft bit decoding sequence of the memory system according to the second embodiment.

FIG. 15 is a flowchart showing an example of a soft bit decoding sequence of the memory system MS according to the second embodiment. The soft bit decoding sequence of the memory system MS according to the second embodiment will be described below with reference to FIG. 15.

When the memory controller 20 starts a soft bit decoding sequence (ST14 in FIG. 8), it performs tracking (ST100) as in the first embodiment.

Based on the tracking results in ST100, the memory controller 20 determines a hard bit read voltage (ST101) as in the first embodiment.

Based on the tracking results in ST100, the memory controller 20 calculates inclination values IL and IR (ST200).

The memory controller 20 calculates a soft bit read voltage based on the second set-value table 263, the hard bit read voltage determined in ST101 and the inclination values IL and IR calculated in ST200. A specific example of a method for calculating a soft bit read voltage in ST201 will be described later.

The memory controller 20 executes soft bit read using the soft bit read voltage calculated in ST201 (ST202). Accordingly, the results of a plurality of soft bit reads read by their respective soft bit read voltages (soft bit read results) are stored in the buffer memory 27.

The memory controller 20 performs a soft bit decoding process using the soft bit read results in ST202 and the LLR table associated with the reference value of the second set-value table 263 in the LLR table set 260 (ST203). The "reference value of the second set-value table 263" corresponds to a value of the second set-value table 263 referenced in the calculation of the soft bit read voltage in ST201.

When the process of ST203 is completed, the memory controller 20 terminates a series of steps shown in FIG. 15 (Return).

[3-2-3] Specific Example of Setting of Soft Bit Decoding Process

Below is a description of a specific example of setting a soft bit decoding process in the memory system MS according to the second embodiment.

(Second Set-Value Table 263)

FIG. 16 is a table showing a specific example of the second set-value table 263 stored in the RAM 26A of the memory controller 20 according to the second embodiment. The second set-value table 263 indicates the inclination values IR and IL as DAC values. In FIG. 16, r1, r2, r3 and r4 each represent the shift value of the soft bit read voltage shown in FIG. 6 as a DAC value. The numerical values of the DAC values shown below are only an example. In the memory system MS according to the second embodiment, as in the first embodiment, the LLR table optimized for each setting of soft bit read voltage is allocated.

In FIG. 16, (1) shows the correspondence between the inclination value IR and the shift values r1 and r2 in the negative direction of the soft bit read voltage. When the inclination value IR is less than 100, r1 and r2 are −20 and −10, respectively. When the inclination value IR is 100 or more and less than 1000, r1 and r2 are −10 and −5, respectively. When the inclination value IR is 1000 or more, r1 and r2 are −4 and −2, respectively. In either case, the intervals between shift values in the negative direction of the soft bit read voltage are equal. Since the inclination value IR is larger, it is expected that the width of the bottom tail of the "S (n)" state among the adjacent states "S (n-1)" and "S (n)" is narrow. Therefore, the memory controller 20 sets the intervals between shift values in the negative direction of the soft bit read voltage to be narrower as the inclination value IR becomes larger.

In FIG. 16, (2) shows the correspondence between the absolute value of the inclination value IL and the shift values r3 and r4 of the soft bit read voltage in the positive direction. When the absolute value of the inclination value IL is less than 100, r3 and r4 are +10 and +20, respectively. When the absolute value of the inclination value IL is 100 or more and less than 1000, r3 and r4 are +5 and +10, respectively. When the absolute value of the inclination value IL is 1000 or more, r3 and r4 are +2 and +4, respectively. In either case, the intervals between shift values in the positive direction of the soft bit read voltage are equal. Since the absolute value of the inclination value IL is larger, it is expected that the width of the upper tail of the "S (n-1)" state among adjacent states "S (n-1)" and "S (n)" is narrow. Therefore, the memory controller 20 sets the intervals between shift values in the positive direction of the soft bit read voltage to be narrower as the absolute value of the inclination value IL becomes larger.

(Soft Bit Read Voltage)

Figure 17:
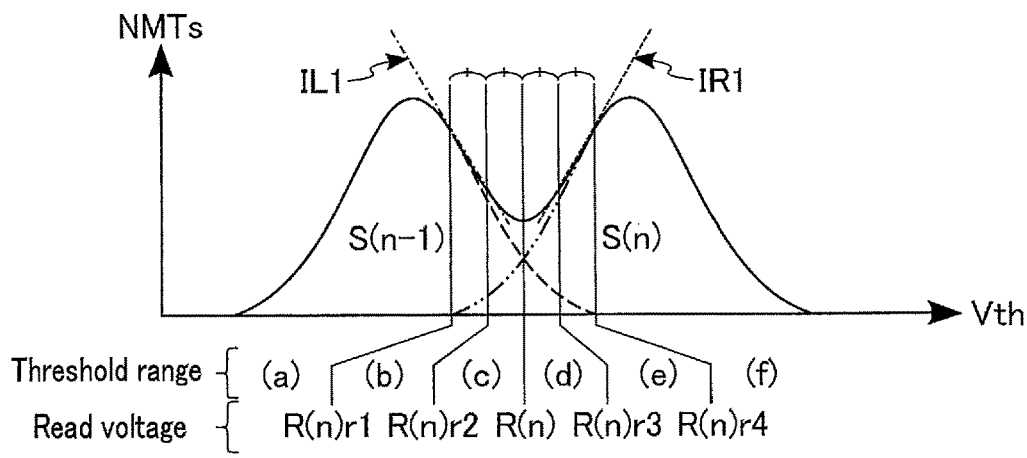
FIG. 17 is a schematic diagram showing a specific example of setting of soft bit read voltages in the memory system according to the second embodiment.
Figure 17:
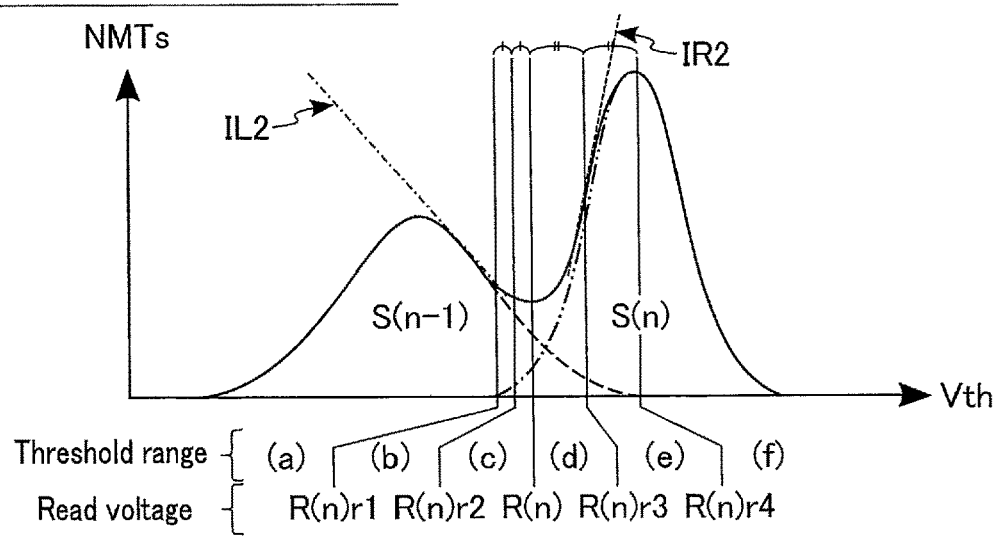
Figure 17:
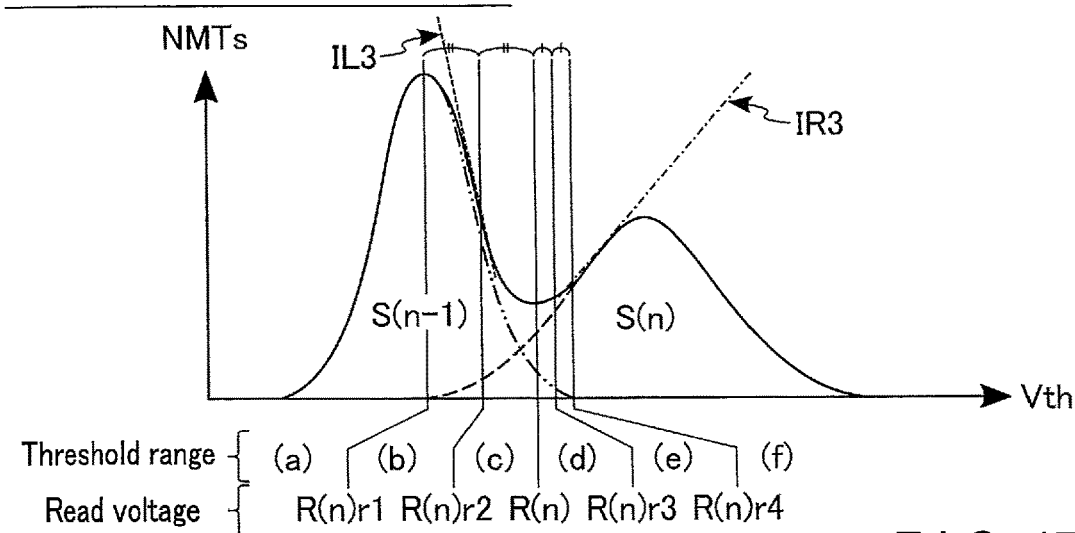

FIG. 17 is a schematic diagram showing a specific example of setting soft bit read voltages in the memory system according to the second embodiment. In FIGS. 17, (1), (2) and (3) each show the threshold voltage distributions of adjacent states "S (n-1)" and "S (n)", and setting examples of threshold ranges and read voltages under different conditions in the second embodiment.

In FIG. 17, (1) shows an example of setting the soft bit read voltage when the shapes of adjacent states "S (n-1)" and "S (n)" are symmetric. In this example, inclination values IR1 and IL1 are calculated based on the shapes of adjacent states "S (n-1)" and "S (n)." The symmetry of the shapes of adjacent states "S (n-1)" and "S (n)" corresponds, for example, to the fact that the absolute values of the inclination values IR1 and IL1 are substantially equal. In this case, the memory controller 20 sets the intervals between threshold ranges (b), (c), (d) and (e) between the soft bit read voltages set between the adjacent states at equal intervals.

In FIG. 17, (2) shows an example of setting the soft bit read voltage when the distribution of the "S (n)" state is steep. In this example, inclination values IR2 and IL2 are calculated based on the shapes of adjacent states "S (n-1)" and "S (n)." The steepness of the distribution of the "S (n)" state corresponds, for example, to the fact that the absolute value of the inclination value IR2 is larger than that of the inclination value IL2 and the absolute value of a difference between the absolute values of the inclination values IR2 and IL2 is larger than a first threshold value. In this case, the memory controller 20 sets the threshold ranges (b) and (c), which are in the negative direction, at equal intervals with reference to R(n) and sets the threshold ranges (d) and (e), which are set in the positive direction, at equal intervals, among the threshold ranges between the soft bit read voltages set between the adjacent states. On the other hand, the memory controller 20 sets the threshold ranges (b) and (c) to be smaller than the threshold ranges (d) and (e), respectively.

In FIG. 17, (3) shows an example of setting the soft bit read voltage when the distribution of the "S (n-1)" state is steep. In this example, inclination values IR3 and IL3 are calculated based on the shapes of adjacent states "S (n-1)" and "5 (n)." The steepness of the distribution of the "S (n-1)" state corresponds, for example, to the fact that the absolute value of the inclination value IR3 is smaller than that of the inclination value IL3 and the absolute value of a difference between the absolute values of the inclination values IR3 and IL3 is larger than a second threshold value. In this case, the memory controller 20 sets the threshold ranges (b) and (c), which are in the negative direction, at equal intervals with reference to R(n) and sets the threshold ranges (d) and (e), which are set in the positive direction, at equal intervals, among the threshold ranges between the soft bit read voltages set between the adjacent states. On the other hand, the memory controller 20 sets the threshold ranges (d) and (e) to be smaller than the threshold ranges (b) and (c), respectively.

[3-3] Advantageous Effects of Second Embodiment

As described above, the memory system MS according to the second embodiment uses the tracking results to dynamically optimize the soft bit read voltage in accordance with the shapes of the threshold voltage distributions. The memory system MS according to the second embodiment uses the tracking results to calculate the inclination values IL and IR and predict the shapes of the tails of adjacent two states based on the inclination values IL and IR. Based on the predicted shapes of the tails, the memory system MS sets the soft bit read voltage so as to divide a range including an error, that is, an overlapped range of the adjacent states. As a result, the memory system MS according to the second embodiment can perform soft bit read by excluding portions which contain few errors and from which no effective information can be obtained. Thus, the memory system MS according to the second embodiment can increase the mutual information content in soft bit decoding and can improve the success probability of the decoding.

[4] Third Embodiment

A third embodiment will be described below. The memory system MS according to the third embodiment has a configuration in which the hard configuration of the memory controller 20 and data stored in the RAM 26 are changed in the memory system MS according to the first embodiment. The memory system MS according to the third embodiment uses soft bit read voltages and LLR values in consideration of a stress state in the soft bit decoding process.

[4-1] Configuration

[4-1-1] Hardware Configuration of Memory Controller 20A

FIG. 18 is a block diagram showing an example of the hardware configuration of a memory controller 20A according to a third embodiment. The memory controller 20A includes a host I/F 21, a memory I/F 22, a CPU 23, an ECC circuit 24, a ROM 25, a RAM 26B, a buffer memory 27, a timer 28 and a temperature sensor 29.

The configuration of each of the host I/F 21, memory I/F 22, CPU 23, ECC circuit 24, ROM 25, RAM 26B and buffer memory 27 is similar to that in the first embodiment. The timer 28 is a clock for use in recording the time when a write operation is performed. The timer 28 may be externally connected to the memory controller 20. The temperature sensor 29 measures the temperature of the memory controller 20. The temperature sensor 29 may be externally connected to the memory controller 20.

[4-1-2] Structure of Data Stored in RAM 26B

FIG. 19 is a block diagram showing an example of data stored in the RAM 26B of the memory controller 20A according to the third embodiment. The RAM 26B stores an LLR table set 260, a stress information table 264 and a set-value table set 265.

The configuration of the LLR table set 260 is similar to that in the first embodiment. The stress information table 264 includes stress information of the nonvolatile memory 10. The stress information includes the number of write/erase (W/E) times for each block, the number of read times for each page, the time for leaving data that has been written. The set-value table set 265 includes parameters for calculating a shift value of the soft bit read voltage in accordance with a stress state.

(Stress Information Table 264)

FIG. 20 is a table showing an example of the stress information table 264 stored in the RAM 26B of the memory controller 20 according to the third embodiment. The stress information table 264 stores, for example, the number of times of W/E, write time, the number of reads, and write temperature for each address.

In the stress information table, an address may be managed for each block, for each page, or in combination. The number of times of W/E indicates the number of times a pair of write and erase operations has been performed for the address. The write time indicates the time when the last write operation was performed for the address, and the table records the time indicated by the timer 28 when a write operation was performed. The number of reads indicates the number of times a read operation was performed after the last data was written to the address. The write temperature indicates the temperature of the memory system MS when a write operation is performed for the address, and the table records the measured value of the temperature sensor 29 when the write operation is performed.

(Set-Value Table Set 265)

FIG. 21 is tables each showing an example of a set-value table set stored in the RAM 26B of the memory controller 20 according to the third embodiment.

The set-value table set 265 includes a table including parameters for calculating the shift value of a soft bit read voltage for each stress state. The set-value table set 265 also stores parameters for calculating the shift amounts r1 to r4 of a soft bit read voltage for each state. The setting of shift amounts of the soft bit read voltage in the "S1" state is applied to the soft bit read between the "S0" and "S1" states. The setting of shift amounts of the soft bit read voltage in the "S2" state is applied to the soft bit read between the "S1" and "S2" states. The setting of shift amounts of the soft bit read voltage in the "S2" state is applied to the soft bit read between the "S2" and "S3" states.

In FIG. 21, (A) is a table associated with the number of times of W/E among the tables included in the set-value table set 265. For example, the number of times of W/E is classified as "small" when the number of times of W/E indicated by the stress information table 264 is smaller than a predetermined number, and it is classified as "large" when the number of times of W/E is equal to or larger than the predetermined number of times. The number of times of W/E may be classified into three or more categories in the set-value table set 265.

In FIG. 21, (B) is a table associated with stored time among the tables included in the set-value table set 265. For example, the stored time is classified as "small" when the time elapsed from the write time indicated by the stress information table 264 to the present time indicated by the time 28 is equal to or shorter than a predetermined time, and it is classified as "large" when it is longer than the predetermined time. In the set-value table set 265, the stored time may be classified into three or more categories.

In FIG. 21, (C) is a table associated with the number of reads among the tables included in the set-value table set 265. For example, the number of reads is classified as "small" when the number of reads indicated by the stress information table 264 is smaller than a predetermined number, and it is classified as "large" when it is equal to or larger than the predetermined number. In the set-value table set 265, the number of reads may be classified into three or more categories.

In FIG. 21, (D) is a table associated with a difference between write and read temperatures among the tables included in the set-value table set 265. The read temperature represents the temperature of the memory system SM when a read operation is performed for the address of the read temperature and corresponds to the measured value of the temperature sensor 29 when the read operation is performed. For example, the difference between write and read temperatures is classified as "small" when a difference between a write temperature indicated by the stress information table 264 and a read temperature when the read operation is performed is smaller than a predetermined threshold value, and it is classified as "large" when it is equal to or larger than the predetermined threshold value. In the set-value table set 265, the difference between write and read temperatures may be classified into three or more categories.

The memory controller 20 can calculate a more preferable shift value of a soft bit read voltage in a stress state during read operation based on the parameters for calculating the shift value of the soft bit read voltage in each table of the set-value table set 265. In the third embodiment, the LLR table set 260 includes an LLR table that is optimized for each combination of soft bit read voltages used in the soft bit read.

In the memory system MS, some of the categories of stress states shown in FIG. 21 may be omitted, a new category may be added, or the categories may be combined. The stress information table 264 may store the shift amount of the soft bit read voltage for each combination of stress states. The memory controller 20 may calculate the shift amount of the soft bit read voltage by weighting the setting of the shift amount for each stress state. The LLR table set 260 may include an LLR table that is optimized for each combination of the categories of stress state classifications. The memory controller 20 may calculate an LLR value to be used in the soft bit decoding process by weighting the LLR table associated with each stress state.

[4-2] Operation

[4-2-1] Soft Bit Decoding Sequence

Figure 22:
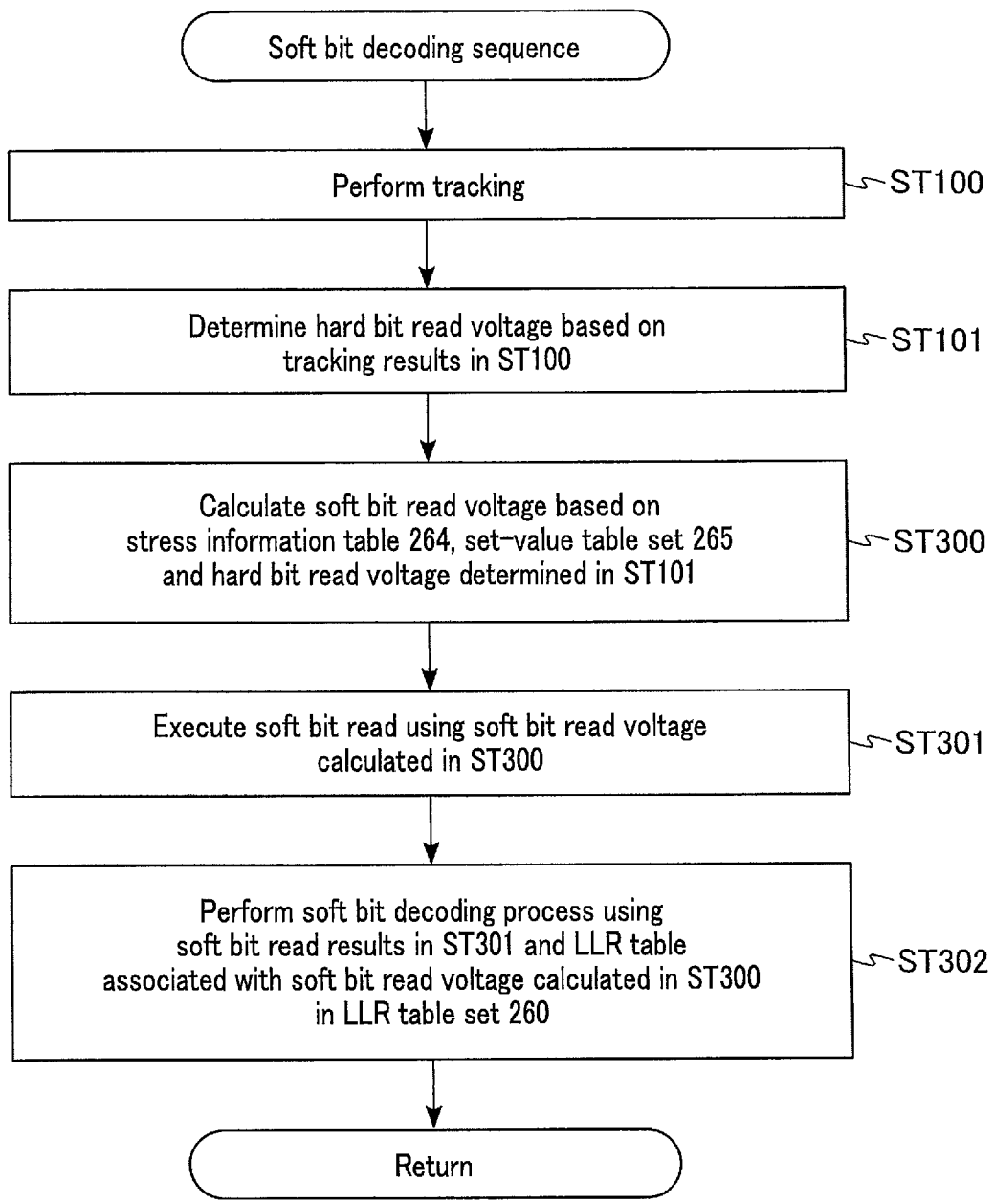
FIG. 22 is a flowchart showing an example of a soft bit decoding sequence of a memory system according to the third embodiment.

FIG. 22 is a flowchart showing an example of a soft bit decoding sequence of the memory system MS according to the third embodiment. The soft bit decoding sequence of the memory system MS according to the third embodiment will be described below with reference to FIG. 22.

When the memory controller 20 starts a soft bit decoding sequence (ST14 in FIG. 8), it performs tracking in the same manner as in the first embodiment (ST100).

Like in the first embodiment, the memory controller 20 determines a hard bit read voltage based on a result of the tracking in ST100 (ST101).

The memory controller 20 calculates a soft bit read voltage based on the stress information table 264, the set-value table sets 265 and the hard bit read voltage determined in ST101 (ST300).

The memory controller 20 executes soft bit read using the soft bit read voltage calculated in ST300 (ST301). Accordingly, the results of a plurality of soft bit reads read by their respective soft bit read voltages (soft bit read results) are stored in the buffer memory 27.

The memory controller 20 performs a soft bit decoding process using the soft bit read results in ST 301 and the LLR table associated with the soft bit read voltage calculated in ST300 in the LLR table set 260 (ST302).

When the process of ST302 is completed, the memory controller 20 terminates a series of processes shown in FIG. 22 (Return).

[4-2-2] Method of Setting Soft Bit Read Voltage

FIG. 23 is a schematic diagram showing an example of a method of setting a soft bit read voltage in the memory system MS according to the third embodiment. In FIGS. 23, (1), (2), (3) and (4) each show threshold voltage distributions ("S0" to "S3" states) in the case of 2 bits/cell and an example of setting a soft bit read voltage in different stress states. SBR1 represents a range of setting a shift bit read voltage between the "S0" and "S1" states. SBR2 represents a range of setting a shift bit read voltage between the "S1" and "S2" states. SBR3 represents a range of setting a shift bit read voltage between the "S2" and "S3" states.

In FIG. 23, (1) shows a threshold voltage distribution immediately after writing. In this case, the spread of the upper tail and the bottom tail of each state is small. Default settings are thus applied to SBR1, SBR2 and SBR3.

In FIG. 23, (2) shows threshold voltage distributions in the case where the number of times of W/E increases. As the number of times of W/E increases, the upper and bottom tails of each state tend to spread due to the fatigue of the memory cell MC. The SBR1, SBR2 and SBR3 are therefore set to be wider than the default values.

In FIG. 23, (3) shows threshold voltage distributions in the case where stored time is long. As the stored time is lengthened, the bottom tail of each state tends to widen due to data retention. Specifically, the shape of each state varies so as to approach an electrical neutral point (for example, a 0V portion located between the "S0" and "S1" states). For example, the higher the threshold voltage, the greater the spread of the bottom tail. The SBR1, SBR2 and SBR3 are thus set so that the shift width of the shift bit read voltage in the negative direction becomes greater as they are closer to the electrical neutral point. On the other hand, the stored time does not cause the spread of the bottom tail, with the result that the shift width of the shift bit read voltage in the positive direction is set to be smaller than the shift width of the shift bit read voltage in the negative direction.

In FIG. 23, (4) shows threshold voltage distributions in the case where the number of reads increases. As the number of reads increases, the upper tail of each state tends to spread due to read disturb. For example, the lower the threshold voltage of a state, the greater the upper tail thereof. The SBR1, SBR2 and SBR3 are thus set so that the shift width of the shift bit read voltage in the positive direction becomes greater as the threshold voltage increases. On the other hand, the number of reads does not cause the spread of the bottom tail, with the result that the shift width of the shift bit read voltage in the negative direction is set to be smaller than the shift width of the shift bit read voltage in the positive direction.

[4-3] Advantageous Effects of Third Embodiment

As described above, the memory system MS according to the third embodiment dynamically optimizes the soft bit read voltage in accordance with stress states such as the number of times of W/E, stored time, and the number of reads. Thus, as in the second embodiment, the memory system MS according to the third embodiment can set the soft bit read voltage so as to divide an appropriate range in conformity to the shape of the threshold voltage distribution. As a result, the memory system MS according to the third embodiment can increase the mutual information content in soft bit decoding and can improve the success probability of the decoding.

[5] Fourth Embodiment

A fourth embodiment will be described below. The memory system MS according to the fourth embodiment has a configuration in which data stored in the RAM 26 is changed in the memory system MS according to the first embodiment. The memory system MS according to the fourth embodiment performs a soft bit decoding process using a dynamic LLR table in read operation.

[5-1] Structure of Data Stored in RAM 26C

FIG. 24 is a table showing an example of data stored in a RAM 26C of a memory controller 26 according to the fourth embodiment. The RAM 26C includes an LLR table set 260 and an estimated LLR table 266.

The configuration of the LLR table set 260 is similar to that in the first embodiment. The estimated LLR table 266 is an LLR table configured with an LLR value calculated based on the soft bit read results. For example, the memory controller 20 uses the result of a soft bit decoding process that has failed in decoding for calculating the estimated LLR table 266. In this case, the memory controller 20 calculates the LLR value using the estimated value of read data obtained from the result of the soft bit decoding process. The calculation of the estimated LLR table 266 may be performed by any other method. For example, the memory controller 20 may use the result of a soft bit decoding process for a cell unit having an environment similar to that of a cell unit that has failed in hard bit decoding.

[5-2] Soft Bit Decoding Process

FIG. 25 is a flowchart showing an example of a soft bit decoding process of a memory system MS according to a fourth embodiment. The soft bit decoding process of the memory system MS according to the fourth embodiment will be described below with reference to FIG. 25.

When the initial soft bit read is completed in the soft bit decoding sequence, an ECC frame (read result by hard bit read and read result by soft bit read) is input to the memory controller 20 (ST400).

The memory controller 20 performs a process of "Nloop=0" (ST401). Nloop is a counter indicating the number of times of performance of the soft bit decoding process.

The memory controller 20 performs the soft bit decoding process using the default LLR table (ST402). The default LLR table corresponds to the LLR table associated with the soft bit read voltage used in the initial soft bit read.

As a result of the soft bit decoding process in ST402, the memory controller 20 checks whether or not the decoding is successful (ST403).

When the memory controller 20 has confirmed in the process of ST403 that the decoding is successful (Yes in ST403), it outputs a decoding result (ST404). The decoding result of ST404 is referred to in the process of ST15 shown in FIG. 8 and includes information indicating that the decoding is successful.

When the process of ST404 is completed, the memory controller 20 terminates a series of steps shown in FIG. 25 (End).

When the memory controller 20 has confirmed that the decoding is unsuccessful (No in ST403), it performs the process of "Nloop=Nloop+1" (ST405).

When the process of ST405 is completed, the memory controller 20 checks whether "Nloop=NloopMAX is satisfied (ST406). NloopMAX is the maximum number of soft bit decoding processes that can be performed in the soft bit decoding sequence.

When the memory controller 20 has confirmed in ST406 that "Nloop=NloopMAX" is not satisfied (No in ST406), it creates the estimated LLR table 266 (ST407).

When the process of ST407 is completed, the memory controller 20 performs the soft bit decoding process using the estimated LLR table 266 (ST408). When the process of ST408 is completed, the memory controller 20 proceeds to ST403.

When the memory controller 20 has confirmed in ST406 that "Nloop=NloopMAX" is satisfied (Yes in ST406), it outputs a decoding result (ST409). The decoding result of ST409 is referred to in the process of ST15 shown in FIG. 8 and includes information indicating that the decoding is unsuccessful.

When the process of ST409 is completed, the memory controller 20 terminates a series of steps shown in FIG. 25 (End).

[5-3] Advantageous Effects of Fourth Embodiment

As described above, the memory system MS according to the fourth embodiment performs a soft bit decoding process using the LLR value calculated based on the soft bit read results in the soft bit decoding sequence. Therefore, the memory system MS according to the fourth embodiment can use a more appropriate LLR table in the soft bit decoding process to improve the success probability of decoding.

[6] Others

It should be noted that each of the first to fourth embodiments may be applied to the case where one memory cell MC stores data of one bit and the case where one memory cell MC stores data of three or more bits. Each of the first to fourth embodiments may be applied regardless of the type of data assignment. The memory system MS has only to execute at least a soft bit decoding sequence and need not perform a hard bit decoding process. Some or all of the operations of the memory controller 20 may be achieved by the CPU 23 executing firmware or by dedicated hardware provided by the memory controller 20.

The embodiments are exemplary and the scope of the invention is not limited thereto.

The invention claimed is:

1. A memory system, comprising:
a nonvolatile memory including a plurality of memory cells; and
a memory controller configured to control the nonvolatile memory,
wherein in read operation for the memory cells, the memory controller is configured to:
perform tracking including a plurality of reads in which a read voltage is shifted;
determine a hard bit read voltage based on results of the tracking;
calculate a soft bit read voltage based on the determined hard bit read voltage;
perform soft bit read using the calculated soft bit read voltage; and
perform a soft bit decoding process using a result of the soft bit read and a log-likelihood ratio table associated with the calculated soft bit read voltage,
wherein:
the memory controller includes a storage circuit configured to store a first table that stores a set value of the soft bit read voltage and a second table that stores a set limit value of the read voltage; and
the memory controller is configured to:
calculate a difference between the determined hard bit read voltage and a set limit value corresponding to the determined hard bit read voltage in the second table; and
calculate a soft bit read voltage using a reference value corresponding to the difference in the first table.

2. The memory system of claim 1, wherein when the difference is less than a first threshold value, the memory controller adjusts intervals between soft bit read voltages set between a soft bit read voltage corresponding to the set limit value and the determined hard bit read voltage.

3. The memory system of claim 2, wherein when the difference is less than the first threshold value, the memory controller adjusts the intervals between soft bit read voltages set between a soft bit read voltage corresponding to the set limit value and the determined hard bit read voltage at equal intervals.

4. The memory system of claim 1, wherein when the difference is equal to or more than a second threshold value, the memory controller adjusts intervals between soft bit read voltages set between a soft bit read voltage corresponding to the set limit value and the determined hard bit read voltage.

5. The memory system of claim 4, wherein when the difference is equal to or more than the second threshold value, the memory controller adjusts the intervals between soft bit read voltages set between a soft bit read voltage corresponding to the set limit value and the determined hard bit read voltage at equal intervals.

6. The memory system of claim 1, wherein:
a threshold voltage distribution of the memory cells includes adjacent first and second states, the second state being higher than the first state; and
the memory controller is configured to:
calculate a first inclination value from a valley portion between the first and second states, based on a result obtained alongside the second state among the results of the tracking; and
adjust intervals between soft bit read voltages set in a negative direction with the determined hard bit read voltage as a reference, based on the first inclination value.

7. The memory system of claim 6, wherein the memory controller adjusts the intervals between soft bit read voltages set in the negative direction more narrowly as the first inclination value becomes larger.

8. The memory system of claim 1, wherein:
a threshold voltage distribution of the memory cells includes adjacent first and second states, the second state being higher than the first state; and
the memory controller is configured to:
calculate a second inclination value from a valley portion between the first and second states, based on a result obtained alongside the first state among the results of the tracking; and
adjust intervals between soft bit read voltages set in a positive direction with the determined hard bit read voltage as a reference, based on the second inclination value.

9. The memory system of claim 8, wherein the memory controller adjusts the intervals between soft bit read voltages set in the positive direction more narrowly as the second inclination value becomes larger.

10. The memory system of claim 1, wherein:
the memory controller includes a storage circuit which stores a stress information table that stores stress states of the memory cells; and
when the memory controller calculates the soft bit read voltage, the memory controller refers to the stress information table and uses a correction value of the soft bit read voltage based on the stress states of the memory cells.

11. The memory system of claim 10, wherein the memory controller uses as the stress states at least one of information items of the number of times of writing and erasure, stored time after writing, the number of times of reading, and temperature during writing.

12. The memory system of claim 1, wherein:
the memory controller configured to include a storage circuit which stores a log-likelihood ratio table set;
the log-likelihood ratio table set includes a plurality of log-likelihood ratio tables;
the log-likelihood ratio tables are each associated with a combination of soft bit read voltages used in the soft bit read and includes log-likelihood ratio information that is optimized for the combination; and
the memory controller uses a log-likelihood ratio table associated with the calculated soft bit read voltage in the soft bit decoding process.

13. The memory system of claim 1, wherein when the memory controller has failed in decoding in the soft bit decoding process, the memory controller is configured to:
calculate a log-likelihood ratio based on the result of the soft bit read; and
perform a soft bit decoding process using an estimated log-likelihood ratio table with the calculated log-likelihood ratio.

14. The memory system of claim 1, wherein upon receiving a read request from an external host device, the memory controller is configured to:
transmit a command set including the read request to the nonvolatile memory;
receive data from the nonvolatile memory after transmitting the command set; and
perform the tracking when the memory controller fails in decoding in a hard bit decoding process using the received data.

15. A memory system, comprising:
a nonvolatile memory including a plurality of memory cells; and
a memory controller which controls the nonvolatile memory,
wherein in read operation for the memory cells, the memory controller is configured to:
perform tracking including a plurality of reads in which a read voltage is shifted;
calculate a soft bit read voltage from results of the tracking; and
perform a soft bit decoding process using the calculated soft bit read voltage,
wherein when the soft bit read voltage is changed in accordance with limitations of a set limit value of the read voltage, the memory controller adjusts intervals between soft bit read voltages set between the changes soft bit read voltage and a hard bit read voltage determined based on the results of the tracking.

16. The memory system of claim 15, wherein:
a threshold voltage distribution of the memory cells includes adjacent first and second states, the second state being higher than the first state; and
the memory controller is configured to:
calculate a first inclination value based on data obtained alongside the second state from a valley portion between the first and second states, based on the results of the tracking for the first and second states;
calculate a second inclination value based on data obtained alongside the first state from the valley part; and
calculate a soft bit read voltage based on the first inclination value and the second inclination value.

17. The memory system of claim 15, wherein:
the memory controller includes a storage circuit configured to store a first table and a second table, the first table storing stress states of the memory cells, the second table storing correction values of soft bit read voltages corresponding to the stress states; and
the memory controller is configured to calculate a soft bit read voltage using the correction values of the soft bit read voltages corresponding to the stress states corresponding to a shape of a threshold voltage distribution estimated based on the results of the tracking.

18. The memory system of claim 15, wherein when the memory controller has failed in decoding in the soft bit decoding process, the memory controller is configured to:
calculate a log-likelihood ratio based on the result of the soft bit read using the calculated soft bit read voltage; and
perform a soft bit decoding process using an estimated log-likelihood ratio table with the calculated log-likelihood ratio.

* * * * *